(12) United States Patent
Cai et al.

(10) Patent No.: US 11,690,250 B2
(45) Date of Patent: Jun. 27, 2023

(54) DISPLAY PANEL AND DISPLAY DEVICE

(71) Applicant: Wuhan Tianma Micro-Electronics Co., Ltd., Wuhan (CN)

(72) Inventors: Min Cai, Wuhan (CN); Zhiqiang Xia, Wuhan (CN); Yangzhao Ma, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/960,041

(22) Filed: Oct. 4, 2022

(65) Prior Publication Data

US 2023/0022759 A1 Jan. 26, 2023

Related U.S. Application Data

(63) Continuation of application No. 17/205,247, filed on Mar. 18, 2021, now Pat. No. 11,502,148.

(30) Foreign Application Priority Data

Dec. 2, 2020 (CN) .......................... 202011398368.X

(51) Int. Cl.
*G02F 1/1368* (2006.01)
*H10K 59/121* (2023.01)
(Continued)

(52) U.S. Cl.
CPC ......... *H10K 59/121* (2023.02); *G02F 1/1368* (2013.01); *G02F 1/13629* (2021.01);
(Continued)

(58) Field of Classification Search
CPC ............... H01L 27/326; H01L 27/3276; G02F 1/13629; G02F 1/1368; H04N 5/2257;
(Continued)

(56) References Cited

U.S. PATENT DOCUMENTS

2019/0363141 A1 11/2019 Ueno
2020/0335043 A1* 10/2020 Zhao .................... G09G 3/3266

FOREIGN PATENT DOCUMENTS

| CN | 110379356 A | 10/2019 |
|---|---|---|
| CN | 110571252 A | 12/2019 |
| CN | 110610667 A | 12/2019 |

\* cited by examiner

*Primary Examiner* — James A Dudek
(74) *Attorney, Agent, or Firm* — Anova Law Group PLLC

(57) ABSTRACT

A display panel includes a display region and a non-display region. The display region includes a first display region and at least one second display region. The first display region at least partially surrounds the at least one second display region. Each second display region of the at least one second display region includes at least two photosensitive device setting regions and a spacing region disposed between the at least two adjacent photosensitive device setting regions. The display region is provided with a plurality of sub-pixels and pixel driving circuits electrically connected to the plurality of sub-pixels. The pixel driving circuits corresponding to the plurality of sub-pixels in the spacing region are electrically connected to the pixel driving circuits located in the first display region through signal lead wires. The signal lead wires are arranged on both sides of sub-pixel rows along a first direction.

20 Claims, 11 Drawing Sheets

(51) Int. Cl.
    *G02F 1/1362*     (2006.01)
    *H04N 23/45*     (2023.01)
    *H04N 23/57*     (2023.01)
    *H10K 59/131*     (2023.01)

(52) U.S. Cl.
    CPC ............. *H04N 23/45* (2023.01); *H04N 23/57* (2023.01); *H10K 59/131* (2023.02)

(58) Field of Classification Search
    CPC ...... H04N 5/2258; H04N 23/45; H04N 23/57; H10K 59/121; H10K 59/131
    See application file for complete search history.

DISPLAY PANEL AND DISPLAY DEVICE

CROSS-REFERENCES TO RELATED APPLICATIONS

This application is a continuation of U.S. patent application Ser. No. 17/205,247, filed on Mar. 18, 2021, which claims the priority of Chinese patent application No. 202011398368.X, filed on Dec. 2, 2020, the entire contents of both of which are incorporated herein by reference.

FIELD OF THE DISCLOSURE

The present disclosure generally relates to the field of display technology and, more particularly, relates to a display panel and a display device.

BACKGROUND

With the development of display technology, display panels have increasingly higher screen-to-body ratios, and full screens have received widespread attention due to their narrow or even borderless display effects. At present, display devices such as mobile phones and tablet computers often need to reserve space for commonly used electronic photosensitive devices, such as front cameras, infrared sensing devices, fingerprint recognition devices, etc. For example, these photosensitive devices are arranged on the top of the front of the display device, and the corresponding position forms a non-display region, thereby reducing the screen-to-body ratio of the device.

In existing technology, in order to increase the screen-to-body ratio, a highly light-transmissive region can be opened in the display region of the display panel to accommodate the photosensitive devices described above.

With the development of full screens, more and more electronic photosensitive devices need to be integrated under the screen. For example, a semi-transparent region is disposed on the display screen, and a camera is disposed under the screen and corresponding to the semi-transparent region. In normal display, the semi-transparent region can be used for display; and when taking photos or videos is needed, the camera may take photos or videos through the semi-transparent region, so that the semi-transparent region can realize the functions of display and picture-taken simultaneously. How to simplify the production process while achieving high transmittance in the semi-transparent region has become one of the technical problems that need to be solved immediately at this stage. The disclosed display panel and display device are directed to solve one or more problems set forth above and other problems in the art.

BRIEF SUMMARY OF THE DISCLOSURE

One aspect of the present disclosure provides a display panel. The display panel includes a display region and a non-display region. The display region includes a first display region and at least one second display region. The first display region at least partially surrounds the at least one second display region. Each second display region of the at least one second display region includes at least two photosensitive device setting regions and a spacing region disposed between the at least two adjacent photosensitive device setting regions. The display region is provided with a plurality of sub-pixels and pixel driving circuits electrically connected to the plurality of sub-pixels. The pixel driving circuits corresponding to the plurality of sub-pixels in the spacing region are electrically connected to the pixel driving circuits located in the first display region through signal lead wires. The signal lead wires are arranged on both sides of sub-pixel rows along a first direction.

Another aspect of the present disclosure provides a display device. The display device includes a display panel and at least one camera. The display panel includes a display region and a non-display region. The display region includes a first display region and at least one second display region. The first display region at least partially surrounds the at least one second display region. Each second display region of the at least one second display region includes at least two photosensitive device setting regions and a spacing region disposed between the at least two adjacent photosensitive device setting regions. The display region is provided with a plurality of sub-pixels and pixel driving circuits electrically connected to the plurality of sub-pixels. The pixel driving circuits corresponding to the plurality of sub-pixels in the spacing region are electrically connected to the pixel driving circuits located in the first display region through signal lead wires. The signal lead wires are arranged on both sides of sub-pixel rows along a first direction. An orthogonal projection of each camera of the at least one camera on a light-emitting surface of the display panel is located in the at least one second display region of the display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various exemplary embodiments of the present disclosure will now be described in detail with reference to the accompanying drawings. It should be noted that unless specifically stated otherwise, the relative arrangement of the components and steps, numerical expressions and numerical values set forth in the embodiments do not limit the scope of the present disclosure. The following description of the at least one exemplary embodiment is merely illustrative, and by no means can be considered as limitations for the application or use of the present disclosure. In addition, it should be noted that, for illustrative purposes, the drawings show, instead of all of the structure, only a part of the structure related to the present disclosure.

It should be noted that techniques, methods, and apparatuses known to those of ordinary skill in the relevant art may not be discussed in detail, but where appropriate, the techniques, methods, and apparatuses should be considered as part of the specification.

It should be noted that in all the examples provided and discussed herein, any specific value should be interpreted as merely exemplary and not as a limitation. Therefore, other examples of the exemplary embodiments may have different values.

It should be noted that similar reference numbers and letters indicate similar items in subsequent figures, and therefore, once an item is defined in a figure, it is not required to be further discussed or defined in the subsequent figures.

Figure 1:
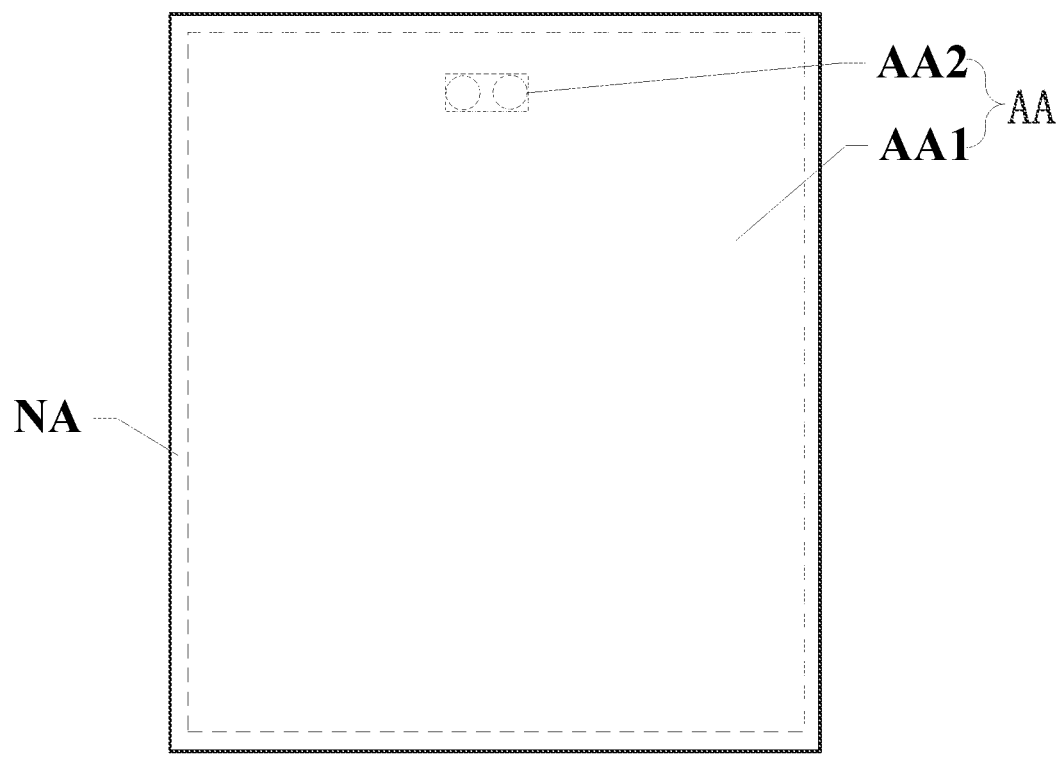
FIG. 1 illustrates a schematic structural diagram of an exemplary display panel according to various embodiments of the present disclosure.
Figure 2:
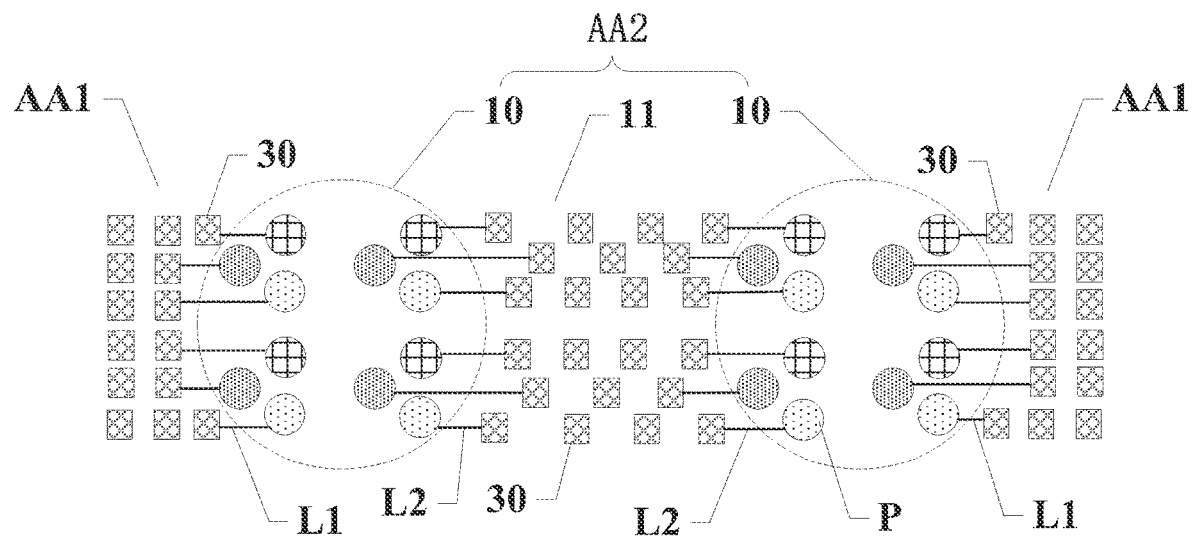
FIG. 2 illustrates a schematic diagram of an exemplary relative position relationship between a semi-transparent region and pixel driving circuits in the semi-transparent region.

The present disclosure provides a display panel. FIG. 1 illustrates a schematic structural diagram of an exemplary display panel according to various embodiments of the present disclosure, and FIG. 2 illustrates a schematic diagram of an exemplary relative position relationship between a semi-transparent region and pixel driving circuits in the semi-transparent region. Referring to FIGS. 1-2, the display panel 100 may include a display region AA and a non-display region NA. The display region AA may include a first display region AA1 and at least one second display region AA2. The first display region AA1 may at least surround the second display region AA2. The second display region AA2 may include at least two semi-transparent regions 10 and a spacing region 11 located between two adjacent semi-transparent regions 10. The display region AA may include a plurality of sub-pixels P and a plurality of pixel driving circuits 30 electrically connected to the plurality of sub-pixels P. The pixel driving circuits 30 electrically connected to the sub-pixels P in the semi-transparent region 10 may be at least partially located in the first display region AA1 and the spacing region 11.

It should be noted that FIG. 1 only shows a case where the display panel 100 includes one second display region AA2. In other embodiments of the present disclosure, according to actual needs, two or more second display regions AA2 may be provided on the display panel 100, and the quantity of the second display regions AA2 included in the display panel is not specifically defined in the present disclosure. In the following, as an example, the display panel 100 is described to include one second display region AA2 for illustration, and when the display panel 100 includes multiple second display regions AA2, the display panel 100 may be implemented with reference to various embodiments of the present disclosure.

Further, FIG. 1 only illustrates a case where the first display region AA1 completely surrounds the second display region AA2. In some other embodiments of the present disclosure, the first display region AA1 may half or partially surround the second display region AA2.

FIG. 1 also only shows a relative position relationship between the first display region AA1 and the second display region AA2 in the display panel 100. In some other embodiments of the present disclosure, the second display region AA2 may be located at any other position in the display panel 100, which is not specifically defined in the present disclosure.

Moreover, the circular shape of the semi-transparent region 10 in FIGS. 1-2 is also only for illustration. In some other embodiments of the present disclosure, the semi-transparent region 10 may have other shape, such as a rectangular shape, an elliptic shape, etc. the size of the semi-transparent region 10 is not specifically limited in the present disclosure and may be set according to actual needs.

FIG. 2 only shows a schematic diagram of the arrangement of sub-pixels in the semi-transparent region 10, and does not represent the actual quantity and size of the sub-pixels. In order to clearly reflect the connection relationship between the sub-pixels in the semi-transparent region and the pixel driving circuits, FIG. 2 does not show the arrangement of sub-pixels in the spacing region 11 and the first display region AA1. The arrangement of sub-pixels in the spacing region 11 and the first display region AA1 is not specifically defined in the present disclosure, and for examples, reference may be made to the arrangement of sub-pixels in existing display panels.

It should be understood that FIGS. 1-2 only take one second display region AA2 including two semi-transparent regions 10 and one spacing region 11 as an example for illustration. In some other embodiments of the present disclosure, one second display region AA2 may include three or more semi-transparent regions 10, and a spacing region 11 may be provided between any two adjacent semi-transparent regions 10. In the present disclosure, only a case where a display region AA2 includes two semi-transparent regions 10 is provided as an example for illustration. When a second display region AA2 includes three or more semi-transparent regions 10, along the arrangement direction of the semi-transparent regions, a spacing region may be disposed between any two adjacent semi-transparent regions. The pixel driving circuits corresponding to the sub-pixels may be located in the two spacing regions on both sides of the semi-transparent region, or in the first display region adjacent to the semi-transparent region, and the arrangement of the pixel driving circuits is not specifically defined in the present disclosure.

In addition, the present disclosure only uses an example where semi-transparent regions included in a same second display region have a same shape and a same size for illustration. In some other embodiments of the present disclosure, the semi-transparent regions included in a same second display region may have different shapes and/or different sizes, which are not specifically defined in the present disclosure.

Figure 3:
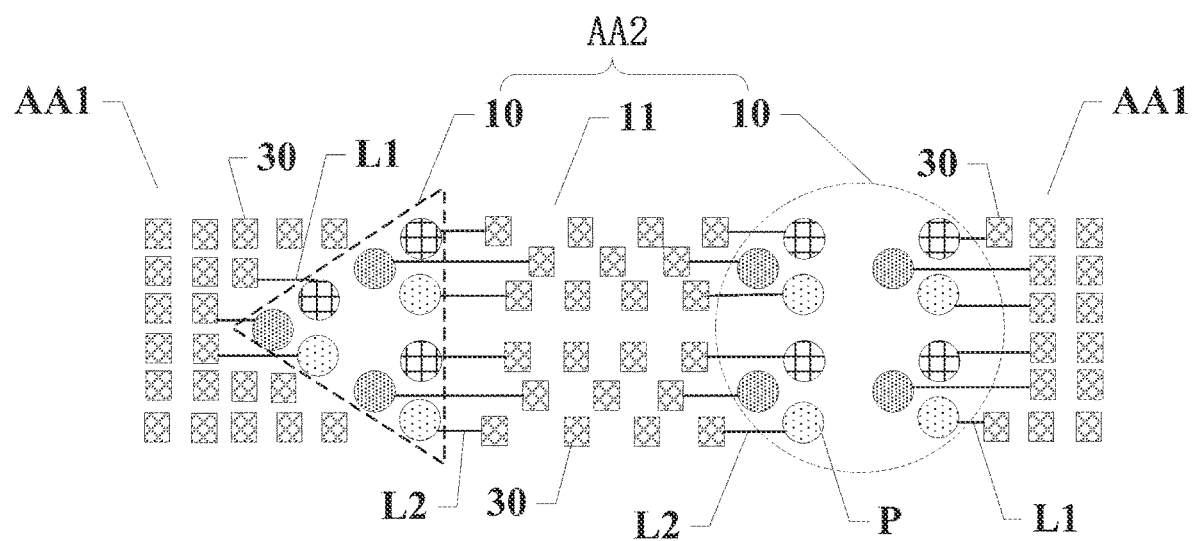
FIG. 3 illustrates a schematic diagram of another exemplary relative position relationship between a semi-transparent region and pixel driving circuits in the semi-transparent region.

For example, FIG. 3 illustrates a schematic diagram of another exemplary relative position relationship between a semi-transparent region and pixel driving circuits in the semi-transparent region. Referring to FIG. 3, the two semi-transparent regions 10 may have different shapes. One semi-transparent region 10 may have a triangular shape, and the other semi-transparent region 10 may have a circular shape. The sizes of the two semi-transparent regions 10 may also be different. The pixel driving circuits 30 electrically connected to the sub-pixels P in each of the two semi-transparent regions 10 may be arranged in the first display region AA1 and the spacing region 11.

Figure 4:
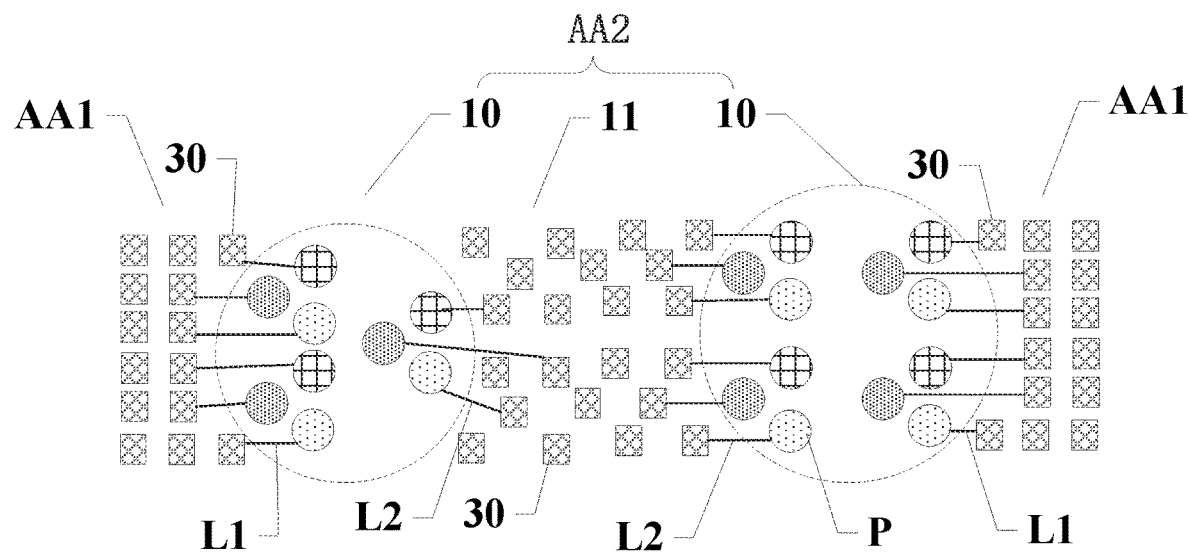
FIG. 4 illustrates a schematic diagram of another exemplary relative position relationship between a semi-transparent region and pixel driving circuits in the semi-transparent region.

FIG. 4 illustrates a schematic diagram of another exemplary relative position relationship between a semi-transparent region and pixel driving circuits in the semi-transparent region. Referring to FIG. 4, in another example, the two semi-transparent regions 10 may have a same shape but different sizes. The pixel driving circuits 30 electrically connected to the sub-pixels P in each of the two semi-transparent regions 10 may be arranged in the first display region AA1 and the spacing region 11.

Further, referring to FIGS. 1-4, the display panel 100 according to various embodiments of the present disclosure may be provided with a first display region AA1 and at least one second display region AA2. The first display region AA1 may at least partially surround the second display region AA2, and the second display region AA2 may include two semi-transparent regions 10 and a spacing region 11 disposed between the two adjacent semi-transparent regions 10. During a display stage, the semi-transparent region 10 and the spacing region 11 in the second display region AA2 may both display; and during a picture-taken stage, the semi-transparent region 10 in the second display region AA2 may serve as a light-transmissive region to implement the photography function.

According to various embodiments of the present disclosure, both the first display region AA1 and the second display region AA2 are provided with a plurality of sub-pixels. It should be noted that, in order to clearly illustrate the principle and content of the present disclosure, FIG. 2 only shows a part of the sub-pixels in the semi-transparent region 10, and a part of the pixel driving circuits 30 in the spacing region 11 and the first display region AA1. The sub-pixels of the spacing region 11 and the first display region AA1 are not shown. It should be understood that sub-pixels are provided in both the spacing region 11 and the first display region AA1, and the sub-pixels in the first display region AA1 and the second display region AA2 are electrically connected to the pixel driving circuits 30, such that the sub-pixels can be driven by the pixel driving circuits 30 to display.

It should be noted that the pixel driving circuits 30 electrically connected to the sub-pixels may be implemented by any appropriate pixel driving circuits in existing technology, such as the 7T1C driving circuits, etc. which is not specifically defined in the present disclosure. The present disclosure introduces a spacing region 11 between two adjacent semi-transparent regions 10, and disposes at least a part of the pixel driving circuits 30, that are electrically connected to the sub-pixels in the semi-transparent region 10, in the first display region AA1 and the spacing region 11. Therefore, reduction of the transmittance of the semi-transparent region 10 due to arrangement of the pixel driving circuits 30 in the semi-transparent region 10 may be avoided, which is conducive to increasing the transmittance of the semi-transparent region 10 and improving the photographic quality.

In one embodiment of the present disclosure, no pixel driving circuit 30 may be provided in each semi-transparent region 10 of the display panel 100, but the corresponding pixel driving circuits 30 may be provided in the first display region AA1 and the spacing region 11. As such, the transmittance of the semi-transparent region 10 may be further improved. Because the pixel driving circuits 30 and the sub-pixels P need to be electrically connected through lead wires, in one embodiment of the present disclosure, a spacing region 11 may be introduced between adjacent semi-transparent regions 10. In addition, the pixel driving circuits 30 electrically connect the sub-pixels in the semi-transparent regions 10 may be partially disposed in the first display region AA1 and partially disposed in the spacing region 11. As such, the wires connecting the pixel driving circuits 30 and the sub-pixels P in the semi-transparent region 10 may extend from the first display region AA1 and the spacing region 11 to the semi-transparent region 10, which is conducive to reducing the wiring density, and further beneficial to reducing crosstalk between adjacent lead wires in the semi-transparent region 10.

In addition, in order to realize the display function, the pixel driving circuits are usually electrically connected with the data lines, and thus the data signals may be obtained through the data lines. According to the present disclosure, when the pixel driving circuits corresponding to the sub-pixels in the semi-transparent region are disposed in the first display region AA1 and the spacing region 11, the winding phenomenon of the data lines that are electrically connected to the pixel driving circuits is reduced, which is conducive to reducing the load on the data lines.

In some examples, when the pixel driving circuits 30 corresponding to the sub-pixels in the semi-transparent region 10 are collectively arranged in the first display region AA1, the lead wires between the sub-pixels in the semi-transparent region 10 and the pixel driving circuits 30 may be gathered between the first display region AA1 and the semi-transparent region 10. To avoid short circuits due to lead aggregation, these lead wires may be arranged in different film layers. When these lead wires are arranged in different film layers, the wires in different film layers may correspond to different manufacturing processes, which may increase the process complexity and may not be conductive to saving production cost.

Therefore, in some embodiments, referring to FIGS. 2-4, a part of the sub-pixels in the semi-transparent region 10 may be electrically connected to the pixel driving circuits 30 in the first display region AA1 through first lead wires L1, and the other part of the sub-pixels in the semi-transparent region may be electrically connected to the pixel driving circuits 30 in the spacing region through second lead wires L2. The first lead wires L1 and the second lead wires L2 may be arranged in a same layer.

For example, when the pixel driving circuits 30 electrically connected to the sub-pixels in the semi-transparent region 10 is disposed in the first display region AA1 and the spacing region 11, a part of the sub-pixels in the semi-transparent region 10 may be connected to the first display region through the first lead wires L1, and the other part of the sub-pixels in the semi-transparent region 10 may be connected to the pixel driving circuits 30 in the first display region AA1 through the second lead wires L2. Further, the first lead wires L1 and the second lead wires L2 may be arranged in a same layer. At this time, the first lead wires L1 and the second lead wires L2 may be made in a same manufacturing process using a same mask. There is no need to introduce different manufacturing processes for the first lead wires L1 and the second lead wires L2. The electrical connections between the sub-pixels of the semi-transparent region 10 and the corresponding pixel driving circuits 30 may be completed by using a single-layer wire, thereby reducing the number of processes, reducing the manufacturing time of the products, and improving the production efficiency of the display panel 100. Further, it may also be conducive to reducing the cost for mask fabrication and saving the production cost.

Figure 5:
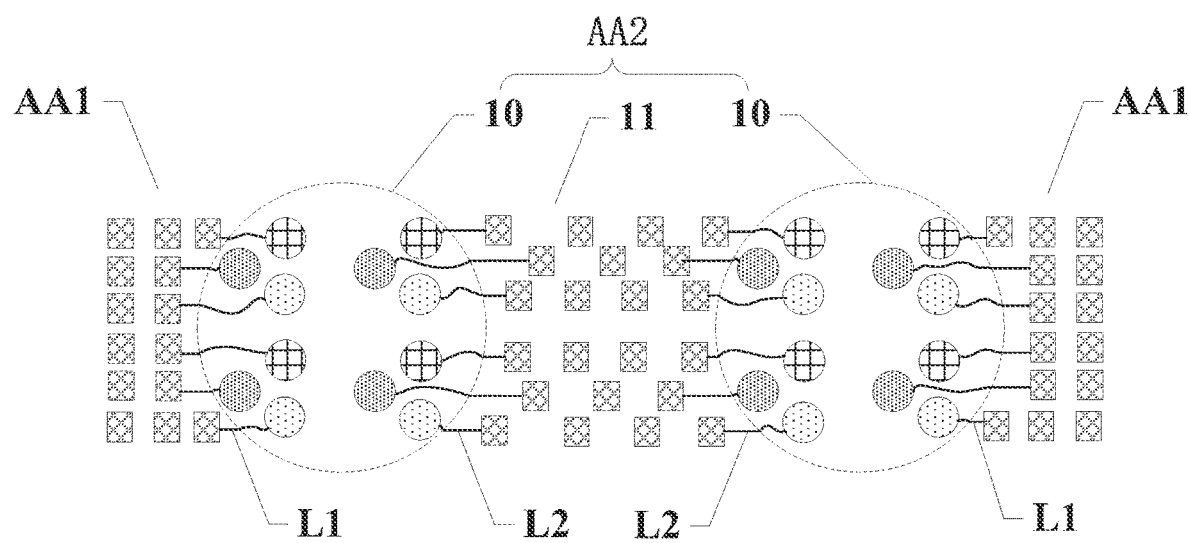
FIG. 5 illustrates a schematic diagram of connections between sub-pixels in a semi-transparent region and first and second lead wires.

FIG. 5 illustrates a schematic diagram of connections between sub-pixels in a semi-transparent region and first and second lead wires. Referring to FIG. 5, in another example, the line segment of each first lead wire L1 located in the semi-transparent region 10 may be set into an arc shape, and the line segment of each second lead wire L2 located in the semi-transparent region 10 may be set into an arc shape.

For example, when the sub-pixels in the semi-transparent region 10 are connected to the corresponding pixel driving circuits 30 in the first display region AA1 or the spacing region 11 through the first lead wires L1 or the second lead wires L2, each first lead wire L1 and each second lead wire L2 may both include a line segment located in the semi-transparent region 10 and a line segment located in the first display region AA1 or the spacing region 11. When the lead wires are arranged in the semi-transparent region 10, gaps may be formed between adjacent lead wires. The presence of the gaps may likely cause light diffraction problems, and the diffraction problems may easily lead to the taken pictures unclear. Also, when there is a straight-line boundary in the semi-transparent region 10 (for example, when the lead wire is a straight line), the phenomenon of the diffraction superposition may take place, thereby greatly affecting the photographic quality. According to various embodiments of the present disclosure, when the line segment of each first lead wire L1 or each second lead wire L2 located in the semi-transparent region 10 is set into an arc shape, the degree of diffraction in the semi-transparent region 10 can be greatly reduced, thereby reducing the effect of diffraction on the pictures taken. As such, setting the line segments of the first lead wires L1 and the second lead wires L2 located in the semi-transparent region 10 into arc shapes may be conducive to improving the clarity of the pictures taken and improving the photographic quality.

In one embodiment, to further suppress the diffraction problems of the semi-transparent region 10, the shape of the sub-pixels in the semi-transparent region 10 may also be set to a shape that includes an arc (e.g., the boundary of the semi-transparent region 10 may include at least one arc), such as a circle as shown in FIGS. 3-5. It should be noted that when the display panel 100 according to the present disclosure is an organic light-emitting display (OLED) panel, the shape of the sub-pixel may refer to the shape of the anode corresponding to the sub-pixel, and when the display panel 100 according to the present disclosure is a liquid crystal display panel, the shape of the sub-pixel may refer to the shape of an opening region of the liquid crystal panel.

In one embodiment of the present disclosure, the first lead wires L1 and the second lead wires L2 may all be transparent lead wires. For example, making the first lead wires L1 and the second lead wires L2 as transparent conductive wires, for example, using indium tin oxide (ITO) or any other appropriate transparent material to form the first lead wires L1 and the second lead wires L2, may be conducive to reducing the shielding degree of the line segments of the first lead wires L1 and the second lead wires L2 in the semi-transparent region 10, thereby helping to further enhance the transmittance of the semi-transparent region 10, and improving the photographic quality when taking pictures through the display panel 100.

Figure 6:
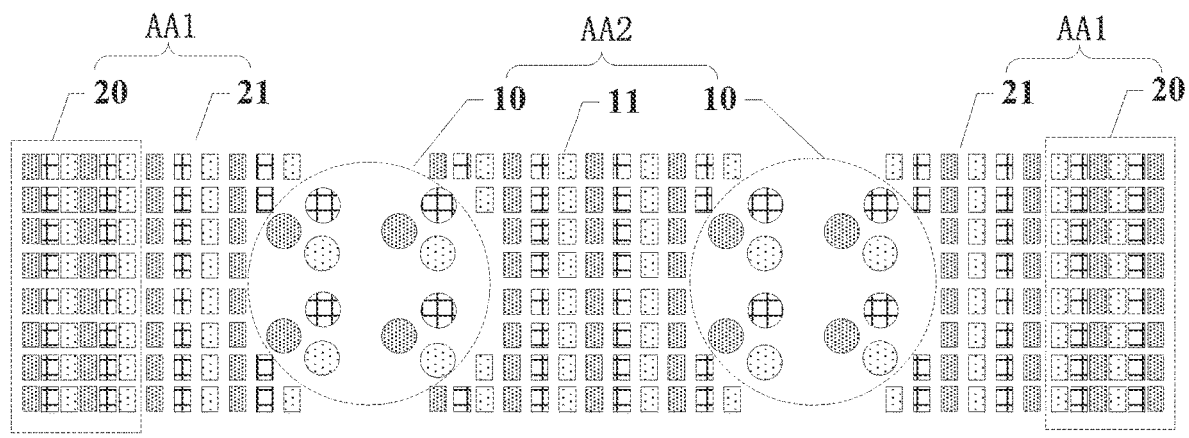
FIG. 6 illustrates a schematic diagram of an exemplary pixel arrangement in a regular region, a transition region, and a second display region according to various embodiments of the present disclosure.

FIG. 6 illustrates a schematic diagram of an exemplary pixel arrangement in a regular region, a transition region, and a second display region according to various embodiments of the present disclosure. Referring to FIGS. 5-6, the first display region AA1 may include a regular region 20 and a transition region 21. The transition region 21 may be located between the regular region 20 and the second display region AA2. The pixel density of the regular region 20 may be greater than or equal to the pixel density of the transition region 21, and the pixel density of the transition region 21 may be greater than or equal to the pixel density of the semi-transparent region 10. The pixel density of the spacing region 11 may be greater than or equal to the pixel density of the semi-transparent region 10, and the pixel density of the spacing region 11 may be greater than or equal to the pixel density of the transition region 21. Further, the pixel driving circuits 30 located in the first display region AA1 and electrically connected to the sub-pixels in the semi-transparent region 10 may be located in the transition region 21.

For example, referring to FIGS. 5-6, the first display region AA1 may be provided with a regular region 20 and a transition region 21. The transition region 21 may be located between the regular region 20 and the second display region AA2. The pixel density of the transition region 21 may be less than the pixel density of the regular region 20, and the pixel density of the transition region 21 may be greater than the pixel density of the semi-transition region 10. When the pixel driving circuits 30 are fabricated in the regular region 20 and the transition region 21, the pixel driving circuits 30 are usually formed according to a same arrangement density in the regular region 20 and the transition region 21. When the pixel density of the transition region 21 is less than the pixel density of the regular region 20, in a same unit area, the quantity of pixel driving circuits 30 required for driving the sub-pixels in the transition region 21 may be smaller than the quantity of pixel driving circuits 30 required for driving the sub-pixels in the regular region

20. As such, the transition region 21 may have more pixel driving circuits 30 than sub-pixels, and the extra pixel driving circuits 30 may be used as pixel driving circuits for driving the sub-pixels in the semi-transparent region 10 to emit light. In addition, according to the present disclosure, because the pixel density of the semi-transparent region 10 and the regular region is very different, the pixel density of the sub-pixels in the transition region 21 may be set to be greater than the pixel density of the sub-pixels in the semi-transparent region 10 but less than the pixel density of the sub-pixels in the regular region 20. The transition region 21 may be able to realize the transition of the pixel density between the semi-transparent region 10 and the regular region 20, thereby avoiding obvious uneven display due to the large difference in the pixel density between the semi-transparent region 10 and the regular region 20 during the display stage. Therefore, the setting of the pixel density of the transition region 21 may also be conducive to improving the display uniformity of the display panel 100 during the display stage.

Figure 7:
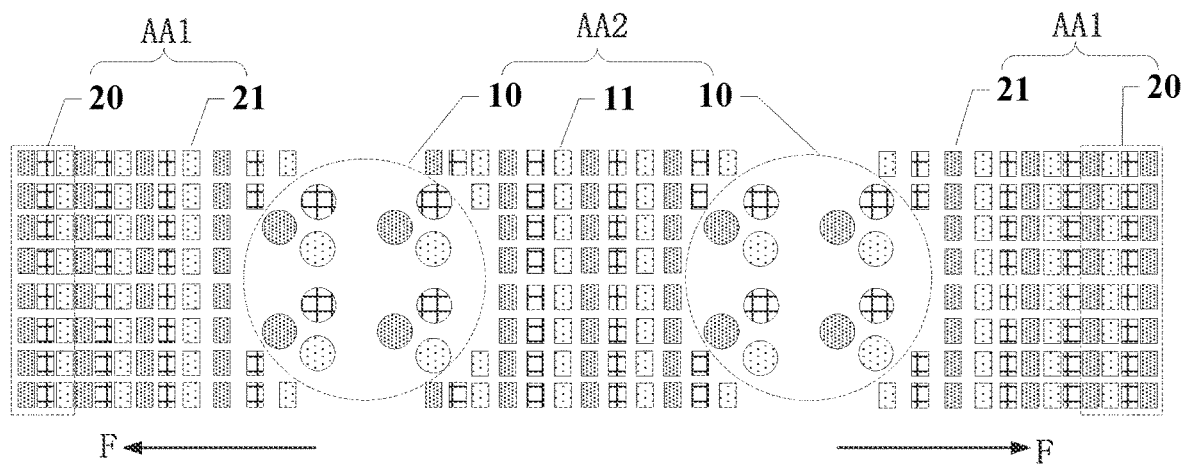
FIG. 7 illustrates a schematic diagram of another exemplary pixel arrangement in a regular region, a transition region, and a second display region according to various embodiments of the present disclosure.

FIG. 7 illustrates a schematic diagram of another exemplary pixel arrangement in a regular region, a transition region, and a second display region according to various embodiments of the present disclosure. Referring to FIG. 7, in one embodiment of the present disclosure, in a direction from the second display region AA2 to the first display region AA1, the pixel density of the transition region increases.

For example, the pixel density of the transition region 21 may be designed in a gradual manner, so that in a direction F pointing from the second display region AA2 to the first display region AA1, the pixel density of the transition region 21 may show an increasing trend. That is, from the semi-transparent region 10 to the regular region 20, the pixel density of the transition region 20 may be increasing. The pixel density of the part of the transition region 21 close to the semi-transparent region 10 may be close to the pixel density of the semi-transparent region 10, and the pixel density of the part of the transition region 21 close to the regular region 20 may be close to the pixel density of the regular region 20. As such, the gradual change in the pixel density of the transition region 21 may be conducive to reducing the display difference between the transition region and the semi-transparent region 10, and at the same time, the gradual change in the pixel density of the transition region 21 may also be conducive to reducing the display difference between the transition region and the regular region 20. Therefore, the gradual change in the pixel density of the transition region 21 may be conducive to further improving the display uniformity of the display panel 100 during the display stage.

Figure 8:
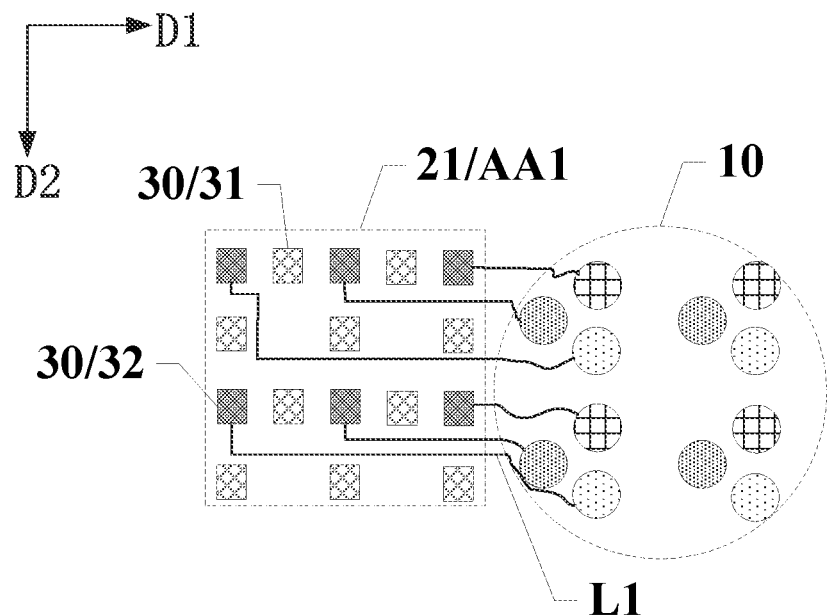
FIG. 8 illustrates a schematic diagram of connections between sub-pixels in a semi-transparent region and corresponding pixel driving circuits in the transition region.

FIG. 8 illustrates a schematic diagram of connections between sub-pixels in a semi-transparent region and corresponding pixel driving circuits in the transition region. It should be noted that FIG. 8 only shows an arrangement of the pixel driving circuits 30 (including a plurality of first pixel driving circuits 31 and a plurality of second pixel driving circuits 32) in the transition region 21, and does not show the sub-pixels in the transition region 21. In actual applications, the transition region 21 is provided with a plurality of sub-pixels electrically connected to the first pixel driving circuits 31 in a one-to-one correspondence for implementing the display function of the transition region 21.

Referring to FIG. 8, in one embodiment of the present disclosure, the pixel driving circuits 30 in the transition region 21 may include a plurality of first pixel driving circuits 31 and a plurality of second pixel driving circuits 32. The first pixel driving circuits 31 may be electrically connected to the sub-pixels in the transition region 21 in a one-to-one correspondence, and the second driving circuits 32 may be electrically connected to the sub-pixels in the semi-transparent region 10. The first pixel driving circuits 31 may be arranged in an array along a first direction D1 and a second direction D2, and each second pixel driving circuit 32 may be arranged between two adjacent first pixel driving circuits 31 along the first direction D1 and/or the second direction D2. The first direction D1 and the second direction D2 may intersect each other.

It should be noted that, to clearly distinguish the first pixel driving circuits 31 and the second driving circuits 32, the first pixel driving circuits 31 and the second pixel driving circuits 32 are illustrated in different filling patterns in FIG. 8. In actual applications, the first pixel driving circuits 31 and the second pixel driving circuits 32 may be formed with the same structure. When fabricating the pixel driving circuits in the display region, usually a plurality of pixel driving circuits arranged in an array is made in the entire display region. Because the pixel density of the transition region is less than the pixel density of the regular region, in the same unit area, the quantity of pixel driving circuits required by the transition region may be less. That is, a part of the pixel driving circuits in the transition region 21 can be used as the first pixel driving circuits 31 for driving the sub-pixels in the transition region 21, and the other part of the pixel driving circuits in the transition region 21 can be electronically connected to the sub-pixels in the semi-transparent region 10 and thus serve as a plurality of second pixel driving circuits 32 for driving the sub-pixels in the semi-transparent region 10.

Figure 9:
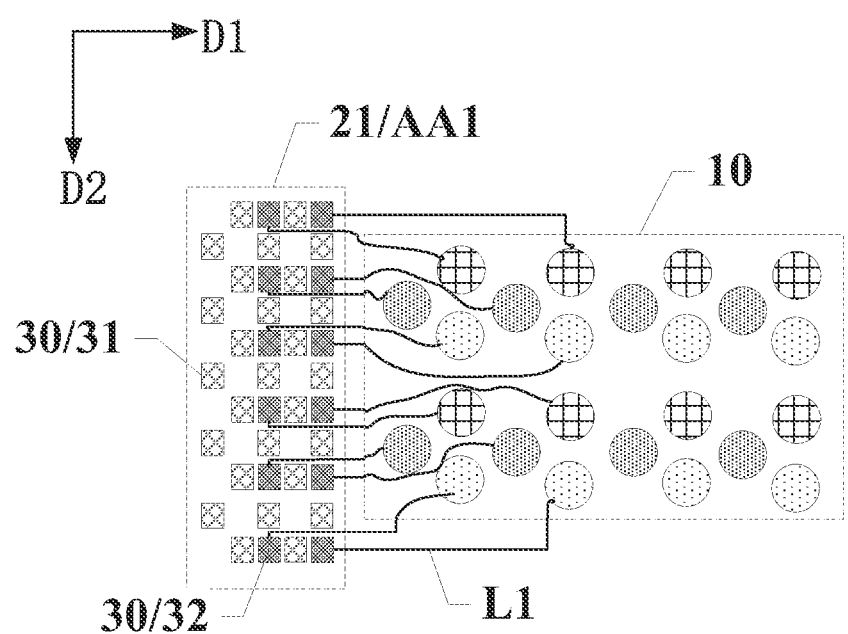
FIG. 9 illustrates another schematic diagram of connections between sub-pixels in a semi-transparent region and corresponding pixel driving circuits in a transition region.

FIG. 9 illustrates another schematic diagram of connections between sub-pixels in a semi-transparent region and corresponding pixel driving circuits in a transition region. Referring to FIG. 9, when the second pixel driving circuits 32 in the transition region 21 are electrically connected to the sub-pixels in the semi-transparent region 10, among the second pixel driving circuits 32 in the transition region 21, the second pixel driving circuits 32 close to the semi-transparent region 10 along the first direction D1 may be electrically connected to the sub-pixels of the semi-transparent region 10 far away from the transition region 21, and the second pixel driving circuits 32 far away from the semi-transparent region 10 may be electrically connected to the sub-pixels of the semi-transparent region 10 close to the transition region 21. As such, the design may be conducive to reducing the length difference of the first lead wires L1 connecting the sub-pixels to the second pixel driving circuits 32, and avoiding the large difference in the load due to the large difference in the length of the first lead wires L1. Therefore, the design may be conducive to improving the uniformity of the display brightness of the sub-pixels in the semi-transparent region 10, and improving the display effect of the semi-transparent region 10.

Figure 10:
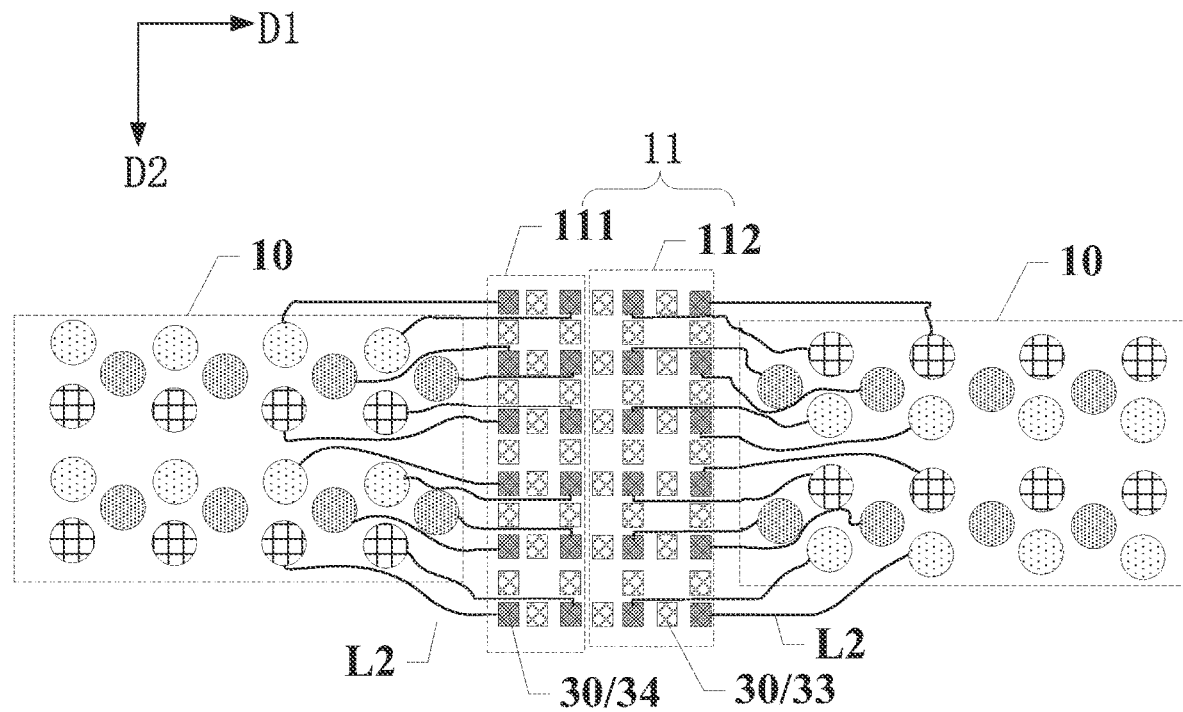
FIG. 10 illustrates a schematic diagram of connections between sub-pixels in a semi-transparent region and corresponding pixel driving circuits in a spacing region.

FIG. 10 illustrates a schematic diagram of connections between sub-pixels in a semi-transparent region and corresponding pixel driving circuits in a spacing region. Referring to FIG. 10, the pixel driving circuits 30 in the spacing region 11 may include a plurality of third pixel driving circuits 33 and a plurality of fourth pixel driving circuits 34. The third pixel driving circuits 33 may be electrically connected to the sub-pixels in the spacing region 11 in a one-to-one correspondence. It should be noted that, to clearly distinguish the third pixel driving circuits 33 and the fourth driving circuits 34, the third pixel driving circuits 33 and the fourth pixel driving circuits 34 are illustrated in different filling patterns in FIG. 10. In actual applications, the third pixel driving circuits 33 and the fourth pixel driving circuits 34 may be formed with the same structure.

Referring to FIG. 10, The third pixel driving circuits 33 may be arranged in an array along a first direction D1 and a second direction D2, and each fourth pixel driving circuit 34 may be arranged between two adjacent third pixel driving circuits 33 along the first direction D1 and/or the second direction D2. The first direction D1 and the second direction D2 may intersect each other.

Along the first direction D1, the spacing region 11 may be located between two semi-transparent region 10. The spacing region 11 may include a first spacing region 111 and a second spacing region 112 arranged along the first direction D1. The first spacing region 111 may be adjacent to one semi-transparent region 10, and the second spacing region 112 may be adjacent to the other semi-transparent region 10. The fourth pixel driving circuits 34 of the first spacing region 111 may be electrically connected to the sub-pixels of the semi-transparent region 10 adjacent to the first spacing region 111, and the fourth pixel driving circuits 34 of the second spacing region 112 may be electrically connected to the sub-pixels of the semi-transparent region 10 adjacent to the second spacing region 112.

For example, referring to FIG. 10, because the spacing region 11 is located between two semi-transparent regions 10, in one embodiment, the spacing region 11 may be divided into a first spacing region 111 and a second spacing region 112, and the first spacing region 111 and a second spacing region 112 may be respectively adjacent to the two semi-transparent regions 10. That is, one semi-transparent region 10 may be located on the side of the first spacing region 111 away from the second spacing region 112, and the other semi-transparent region 10 may be located on the side of the second spacing region 112 away from the first spacing region 111. The fourth pixel driving circuits 34 corresponding to a part of the sub-pixels of the semi-transparent region 10 adjacent to the first spacing region 111 may be disposed in the first spacing region 111, and the fourth pixel driving circuits corresponding to a part of the sub-pixels of the semi-transparent region 10 adjacent to the second spacing region 112 may be disposed in the second spacing region 112. As such, the fourth pixel driving circuits 34 of the spacing region 11 may be electrically connected to the sub-pixels in the semi-transparent region 10 in a close-connection manner, which may be conducive to simplifying the wiring process of the display panel 100.

It should be noted that FIG. 10 only shows an arrangement of the pixel driving circuits 30 in the spacing region 11, and does not show the sub-pixels in the spacing region 11. In actual applications, the spacing region 11 is provided with a plurality of sub-pixels electrically connected to the third pixel driving circuits 33 in a one-to-one correspondence for implementing the display function of the spacing region 11. The third pixel driving circuits 33 and the fourth pixel driving circuits 34 may be together arranged in an array along the first direction D1 and the second direction D2.

It should be understood that when the fourth pixel driving circuits 34 in the first spacing region 111 are electrically connected to the sub-pixels in the semi-transparent region 10, among the fourth pixel driving circuits 34 in the first spacing region 111, the fourth pixel driving circuits 34 close to the semi-transparent region 10 may be electrically connected to the sub-pixels in the semi-transparent region 10 that are far away from the first spacing region 111, and the fourth pixel driving circuits far away from the semi-transparent region 10 may be electrically connected to the sub-pixels in the semi-transparent region 10 that are close to the first spacing region 111. The fourth pixel driving circuits 34 in the second spacing region 112 and the sub-pixels in the semi-transparent region 10 may also adopt similar designs. Therefore, the design may be conducive to reducing the length difference of the second lead wires L2 connecting the sub-pixels to the corresponding fourth pixel driving circuits 34, and avoiding the large difference in the load due to the large difference in the length of the second lead wires L2. Therefore, the design may be conducive to improving the uniformity of the display brightness of the sub-pixels in the semi-transparent region 10, and improving the display effect of the semi-transparent region 10.

It should be noted that the embodiments illustrated in FIGS. 2-7 show a situation where the pixel driving circuits 30 corresponding to the sub-pixels in the semi-transparent region 10 are provided in the transition region 21 and the spacing region 11 on both sides of the semi-transparent region 10 along the first direction D1, and in other embodiments, when the pixel driving circuits connected to the sub-pixels in the semi-transparent region 10 are provided in the transition region 21, the pixel driving circuits 30 may be located in the transition region 21 on both side of the semi-transparent region 10 along the second direction D2.

Figure 11:
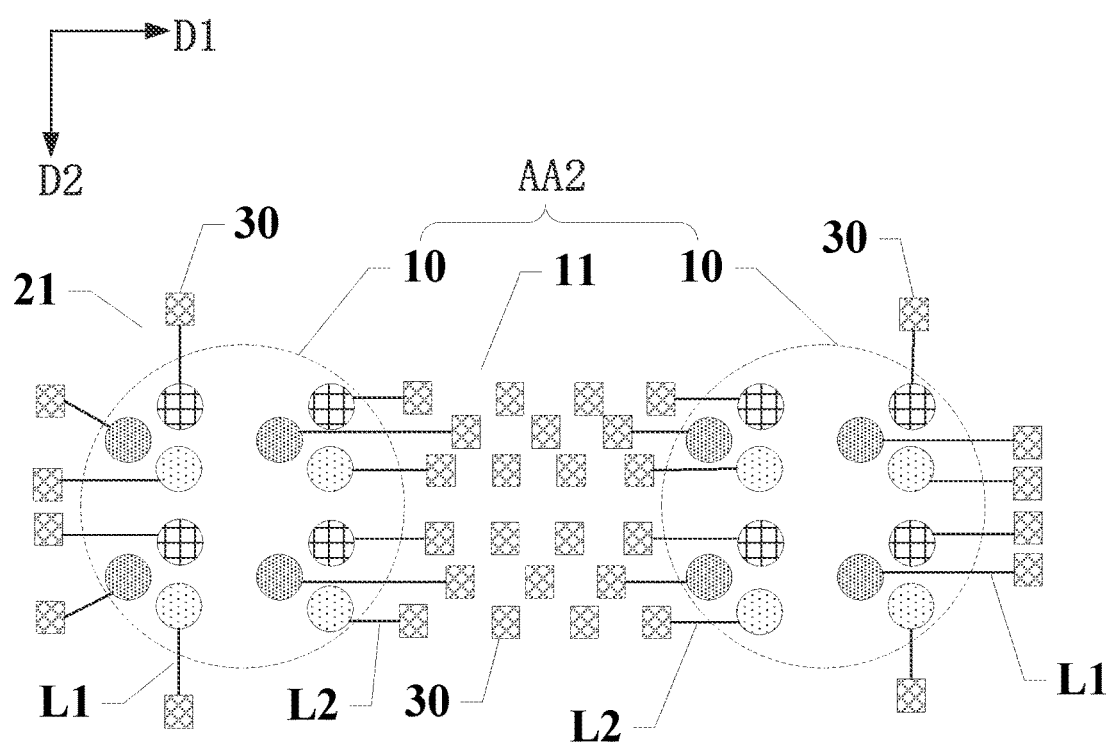
FIG. 11 illustrates another schematic diagram of connections between sub-pixels in a semi-transparent region and corresponding pixel driving circuits in a transition region.

FIG. 11 illustrates another schematic diagram of connections between sub-pixels in a semi-transparent region and corresponding pixel driving circuits in a transition region. Referring to FIG. 11, the pixel driving circuits 30 may be located in the transition region 21 on both side of the semi-transparent region 10 along the second direction D2. The arrangement shown in FIG. 11 may be more conducive to avoiding the aggregation of the first lead wires L1 that connect the sub-pixels in the semi-transparent region 10 to the pixel driving circuits 30 in the transition region 21. As such, when realizing the arrangement of the first lead wires L1 and the second lead wires L2 in the same layer, the design may also be conducive to reducing the wiring difficulty of the first lead wires L1.

Figure 12:
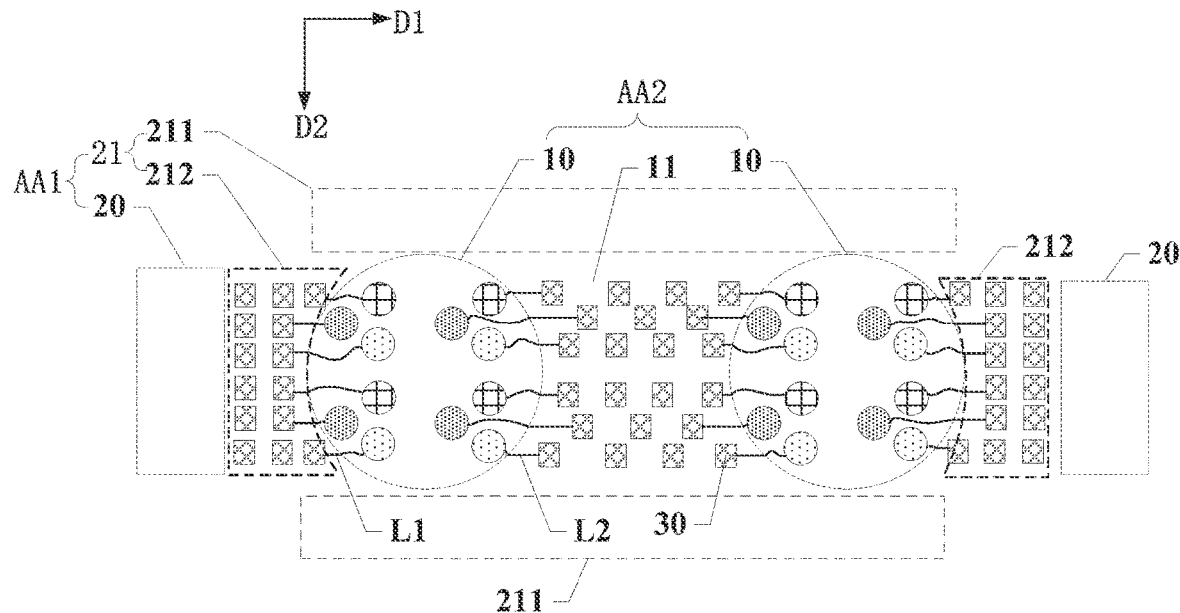
FIG. 12 illustrates a schematic diagram of an exemplary relative position relationship between a semi-transparent region and a transition region and between the semi-transparent region and a spacing region.

FIG. 12 illustrates a schematic diagram of an exemplary relative position relationship between a semi-transparent region and a transition region and between the semi-transparent region and a spacing region. Referring to FIG. 12, in a same second display region AA2, the semi-transparent region 10 and the spacing region 11 may be arranged along the first direction D1. The first display region AA1 may include a regular region 20 and a transition region 21. The transition region 21 may be located between the regular region 20 and the second display region AA2. The transition region 21 may include at least one first transition region 211 and at least one second transition region 212. The at least first transition region 211 may be arranged on at least one side of the second display region AA2 along a second direction D2, and the at least one second transition region 212 may be arranged on at least one side of the second display region AA2 along a first direction D1. The first direction D1 and the second direction D2 may intersect each other. The pixel driving circuits 30 located in the first display region AA1 and electrically connected to the sub-pixels in the semi-transparent region 10 may be located in the second transition region 212.

It should be noted that FIG. 12 only takes the second display region AA2 including two semi-transparent regions 10 and one spacing region 11 as an example for illustration. In one embodiment, the transition region 21 may include two first transition regions 211 oppositely disposed on the two sides of the second display region AA2 along the first direction D1 and two second transition regions 212 oppositely disposed on the two sides of the second display region AA2 along the second direction D2. It should e noted that both the first transition regions 211 and the second transition regions 212 are provided with sub-pixels. In order to clearly reflect the connection relationship between the sub-pixels in the semi-transparent region 10 and the pixel driving circuits 30, the figure does not show the sub-pixels arranged in the first transition region 211 and the second transition region 212. The pixel driving circuits 30 arranged in the first display region AA1 and electrically connected to the sub-pixels in the semi-transparent region 10 may be located in the second transition region 212. In the viewing angle shown in FIG. 12, the pixel driving circuits 30 in the transition region 21 electrically connected to the sub-pixels in the semi-transparent region may be located in the transition region 21 on the left or right side of the semi-transparent region 10, that is, located in the second transition region 212 opposite to the spacing region 11. As such, the design may be equivalent to arranging the pixel driving circuits 30 that are connected to the sub-pixels in the semi-transparent region 10 on opposite sides of the semi-transparent region 10 along the first direction D1. At this time, the first lead wires L1 and the second lead wires L2 may together tend to extend in the first direction D1, which may be conducive to avoiding the winding phenomenon that may occur when the first lead wires L1 and the second lead wires L2 extend in different directions.

Figure 13:
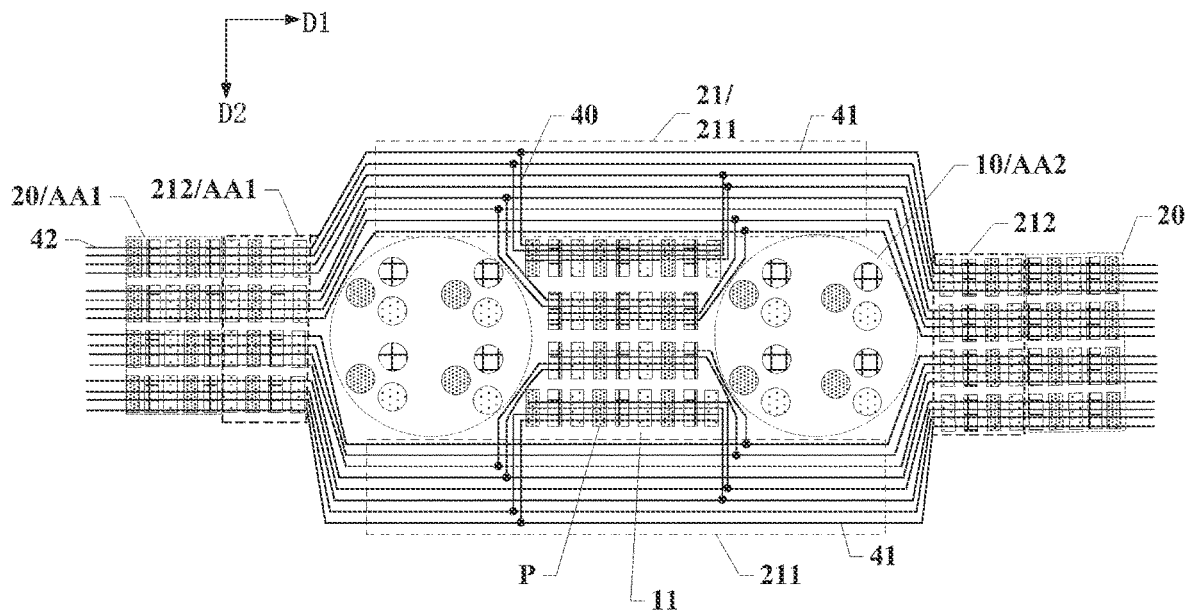
FIG. 13 illustrates a schematic diagram of a plurality of lead wires located between a semi-transparent region and a transition region and between the semi-transparent region and a spacing region.

FIG. 13 illustrates a schematic diagram of a plurality of lead wires located between a semi-transparent region and a transition region and between the semi-transparent region and a spacing region. Referring to FIG. 13, the first transition region 211 may include a plurality of first signal lines 41 extending along the first direction D1 and arranged along the second direction D2. The pixel driving circuits 30 located in the spacing region 11 may be electrically connected to the first signal lines 41.

Referring to FIG. 13, in one embodiment, each second display region of the at least one second display region includes at least two photosensitive device setting regions and a spacing region disposed between the at least two adjacent photosensitive device setting regions. The display region is provided with a plurality of sub-pixels and pixel driving circuits electrically connected to the plurality of sub-pixels. The pixel driving circuits corresponding to the plurality of sub-pixels in the spacing region are electrically connected to the pixel driving circuits located in the first display region through signal lead wires.

Referring to FIG. 13, in one embodiment, a plurality of first signal lines extending along the first direction and arranged along a second direction, wherein the pixel driving circuits located in a same row in the first display region and the second display region are electrically connected through the first signal lines and the signal lead wires.

Referring to FIG. 13, in one embodiment, the pixel driving circuits located in a same row in the spacing region correspond to the signal lead wires. A part of the signal lead wires is located at a first side of the sub-pixel rows, and another part of the signal lead wires is located at a second side of the sub-pixel rows Referring to FIG. 13, in one embodiment, the at least two photosensitive device setting regions are semi-transparent regions. The pixel driving circuits that are electrically connected to the plurality of sub-pixels in the semi-transparent regions at least partially located in the first display region and the spacing region.

For example, because the spacing region 11 is provided with pixel driving circuits 30 for driving the sub-pixels in the spacing region 11 to emit light, and at the same time, also provided with pixel driving circuits 30 for driving the sub-pixels in the semi-transparent region 10 to emit light, in order to realize the normal operation of these pixel driving circuits, the pixel driving circuits 30 may need to be connected to signal lead wires to realize signal transmission. According to one embodiment of the present disclosure, the first signal lines 41 connected to the pixel driving circuits 30 in the spacing region 11 may be arranged in the first transition region 211, and the first signal lines 41 may extend in the first transition region 211 along the first direction D1 and arranged along the second direction D2. As such, the first signal lines 41 may not need to be arranged around the semi-transparent region 10, but extend long the first direction 10 in the first transition region 211 to achieve electrical connections with the pixel driving circuits 30 in the spacing region 11. Compared with the form in which the first signal lines are arranged in the spacing region 11, the design according to the present disclosure is equivalent to moving the first signal lines 41 in the spacing region 11 outward, so that the spacing region 11 may save space for arranging pixel driving circuits 30 to connect the sub-pixels in the semi-transparent region 10.

In one embodiment, the first signal lines 41 may be distributed in two first transition regions oppositely arranged on the two sides of the semi-transparent region o10 long the second direction D2, e.g., distributed on the upper and lower sides of the semi-transparent region 10 in the viewing angle shown in FIG. 13. The pixel driving circuits 30 in the spacing region 11 close to the first transition region 211 and on the upper side of the spacing region 11 may be electrically connected to the first signal lines 41 located on the upper side of the spacing region 11, and the first signal lines 41 in the spacing region 11 close to the first transition region 211 and on the lower side of the spacing region 11 may be electrically connected to the first signal lines 41 on the lower side of the spacing region 11. As such, the connection complexity of the pixel driving circuits 30 and the first signal lines 41 in the spacing region may be reduced.

In one embodiment of the present disclosure, the plurality of first signal lines 41 shown in FIG. 13 may include at least one of a gate line, a light-emission control signal line, and a reset signal line. The pixel driving circuit usually includes a plurality of transistors, which need to be provided with different signals. For example, a signal for controlling a transistor to turn on or turn off may be provided to the control terminal of the transistor through a gate line; when a transistor is used as a light-emitting control switch, a light-emitting control signal may be provided to the control terminal of the transistor through a light-emitting control signal line; when a transistor is used as a reset module, a reset signal may be provided to the transistor through a reset signal line, etc.

In another embodiment of the present disclosure, referring to FIG. 13, the sub-pixels in the spacing region 11 may be arranged in an array along the first direction D1 and the second direction D2. The pixel driving circuits corresponding to the sub-pixels in a same row may be electrically connected to a same first signal line 41 through a same signal lead wire 40. The signal lead wires 40 may extend along the second direction D2.

It should be noted that FIG. 13 only shows the sub-pixels in the spacing region 11, and does not show the pixel driving circuits in the spacing region 11. In actual applications, the spacing region 11 is provided with a plurality of pixel driving circuits 30, and the arrangement of the plurality of pixel driving circuits 30 may refer to FIG. 12. Each sub-pixel in the spacing region 11 may be electrically connected to a pixel driving circuit 30 in the spacing region 11. In one example, the first signal line 41 may be electrically connected to a second signal line 42 in the first display region AA1. The sub-pixels in the spacing region 11 may be arranged in an array along the first direction D1 and the second direction D2. When the pixel driving circuits 30 are electrically connected to the corresponding first signal lines 41, for a part of the sub-pixel rows in the spacing region 11, each sub-pixel row may be arranged in a same row with a sub-pixel row in the first display region AA1. That is, for some sub-pixel rows in the spacing region 11, each sub-pixel row may be aligned with a corresponding sub-pixel row in the first display region AA1. At this time, the pixel driving circuits 30 corresponding to the sub-pixels in the same row in the spacing region 11 and the first display region AA1 may be electrically connected to a first signal line 41 and a second signal line 42 that are electrically connected to each other. As such, even when the first signal line 41 is routed on the upper side or the lower side of the semi-transparent region 10, the driving chip may still be ensured to provide signals to sub-pixels in the same pixel row in the spacing region 11 and the first display region AA1 according to the original timing.

In addition, the sub-pixels in the same row in the spacing region 11 may be electrically connected to the same first signal line 41 through a signal lead wire 40, and the signal transmitted from the same first signal line 41 may be transmitted to each of the pixel driving circuits 30 corresponding to the same row of sub-pixels through the signal lead wire 40. As such, the design may be conducive to reducing the quantity of the signal lead wires 40 for connecting the plurality of first signal lines 41 to the pixel driving circuits 30, which may be conducive to reducing the space occupied by the signal lead wires 40 in the spacing region 11. Therefore, the design may be conducive to reducing the size of the spacing region 11. When the size of the spacing region 11 is small, the overall display uniformity of the display panel may be further improved.

It should also be noted that the pixel driving circuits 30 corresponding to the sub-pixels in the same row in the spacing region may need to be electrically connected to a plurality of first signal lines 41 at the same time. FIG. 13 shows a case where the pixel driving circuits 30 corresponding to the sub-pixels in a same row in the spacing region respectively connected to four first signal lines 41. In addition, the case shown in FIG. 13 only takes the spacing region 11 including four rows of sub-pixels as an example for illustration. In actual applications, the spacing region 11 may include more sub-pixel rows, and the present disclosure does not specifically limit the quantity of sub-pixel rows. The pixel driving circuits 30 corresponding to the sub-pixels in different rows in the spacing region 11 may be respectively connected to different first signal lines 41. For the same first signal line 41, the first signal line 41 may be connected to the pixel driving circuits corresponding to a row of sub-pixels through a signal lead wire 40 extending in the second direction D2.

Referring to FIG. 13, in one embodiment, in the spacing region 11, the signal lead wires 40 may be arranged on both sides of the sub-pixel row along the first direction D1. For example, in the spacing region 11, the pixel driving circuits 30 corresponding to sub-pixels in a same row may be electrically connected to a plurality of first signal lines 41 respectively though a plurality of signal lead wires 40. The quantity of the signal lead wires 40 may correspond to the quantity of the first signal lines 41. When a plurality of sub-pixel rows is formed in the spacing region 11, the quantity of corresponding first signal lines 41 and the quantity of corresponding signal lead wires 40 may be both large. According to one embodiment of the present disclosure, arranging the signal lead wires 40 on both sides of the sub-pixel row along the first direction D1 may be conducive to avoiding the phenomenon that the signal lead wires 40 gather on one side of the sub-pixel row, and thus may be conducive to making efficient use of the spacing region 11 and making the space of the spacing region more uniform on both sides along the first direction D1.

Figure 14:
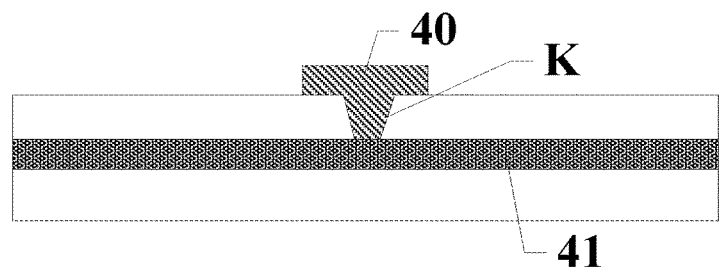
FIG. 14 illustrates a schematic diagram of an exemplary relative position relationship between a first signal line and a signal lead wire that is electrically connected to the first signal line.

FIG. 14 illustrates a schematic diagram of an exemplary relative position relationship between a first signal line and a signal lead wire that is electrically connected to the first signal line. Referring to FIG. 14, in one embodiment, the signal lead wire 40 and the first signal line 41 may be disposed in different film layers. When the signal lead wire 40 and the first signal line 41 are disposed in different film layers, the signal lead wire 40 and the first signal line 41 may be connected through a via K. The introduction of the signal lead wire 40 may not occupy the space of the film layer where the first signal line 41 is located, thereby conducive to improving the flexibility of the arrangement of the signal lead wire 40. In addition, the design may also be conducive to avoiding forming electrical connections between the same signal lead wire 40 and other first signal lines 41, thereby improving the reliability of the electrical connection between the signal lead wire 40 and the first signal line 41.

Figure 15:
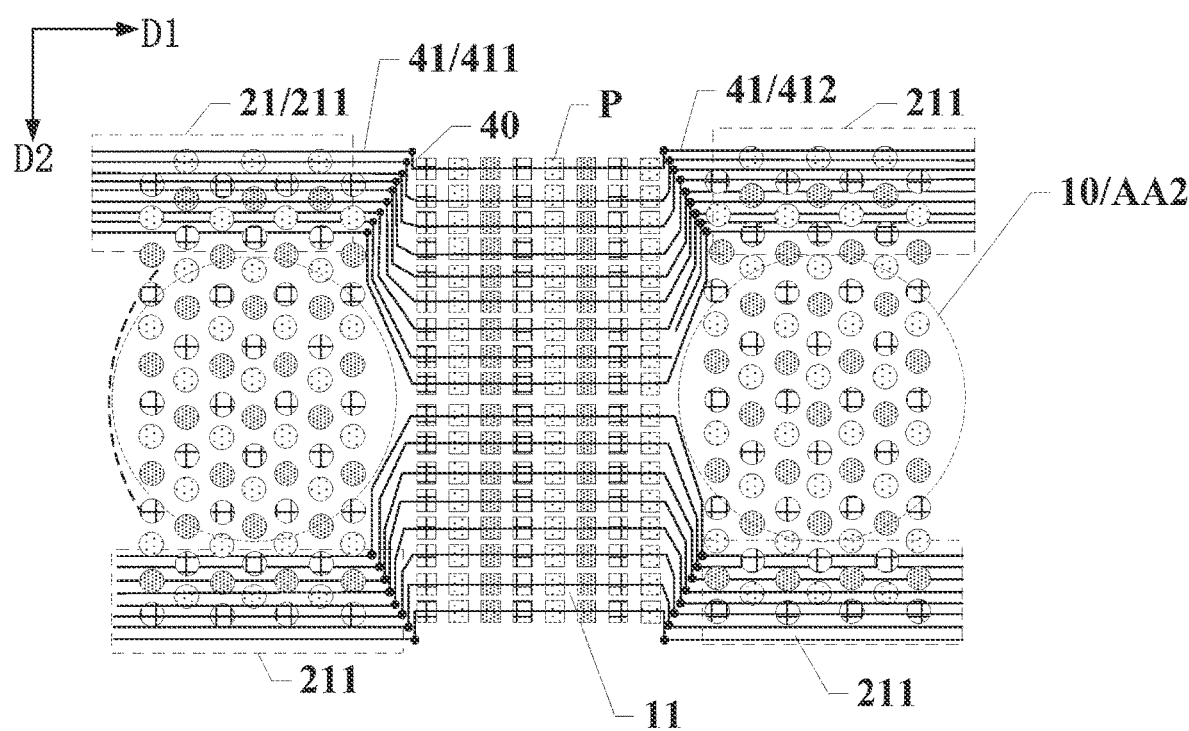
FIG. 15 illustrates another schematic diagram of a plurality of lead wires located between a semi-transparent region and a transition region and between the semi-transparent region and a spacing region.

FIG. 15 illustrates another schematic diagram of a plurality of lead wires located between a semi-transparent region and a transition region and between the semi-transparent region and a spacing region. Referring to FIG. 15, along the second direction D2, two first transition regions 211 may be respectively provided on both sides of each of the two semi-transparent regions 10. In one embodiment, the pixel density in the transition region 211 may be the same as the pixel density in the semi-transparent region 10, and the pixel driving circuit electrically connected to the sub-pixels in the first transition region 211 may be located in the spacing region 11 and the first display region. It should be noted that FIG. 15 does not show the pixel driving circuits connected to the sub-pixels in the semi-transparent region 10 and the first transition region 211. For the connection relationship, reference may be made to FIG. 12.

In the following, the first signal line 41 located on the upper side of the semi-transparent regions is taken as an example to illustrate the difference between the structures shown in FIG. 13 and FIG. 15. Referring to FIG. 15, the first signal line 41 may include a line segment 411 disposed on the upper side of one semi-transparent region 10 and a line segment 412 disposed on the upper side of the other semi-transparent region 10. The line segment 411 and the line segment 412 may be arranged and electrically connected in a one-to-one correspondence, and the two line segments arranged in a one-to-one correspondence may be electrically connected to the sub-pixels in a same row in the spacing region 11 through signal lead wires 40. In one embodiment, the first signal line 41 may not directly extend from one first transition region 211 to another first transition region 211 along the first direction D1, but may extend toward the sub-pixels P of the spacing region 11 through the signal lead wires 40, thereby saving a certain space between the two first transition regions 211 arranged in the first direction. As such, the sub-pixels in the first transition region 211 may be easily connected to the pixel driving circuits in the spacing region 11. It should be noted that in the viewing angle of FIG. 15, the arrangement and connection configurations for the first signal lines 41 located on the lower side of the semi-transparent regions 10 can be referred to the arrangement and connection configurations for the first signal liens 41 located on the upper side of the semi-transparent regions 10, and the details will not be repeated here. It should also be noted that FIG. 15 does not show the connection relationship between the first signal line 41 and the second signal line 42 in the first display region, and for the connection relationship between the first signal line 41 and the second signal line 42, reference may be made to FIG. 13.

Figure 16:
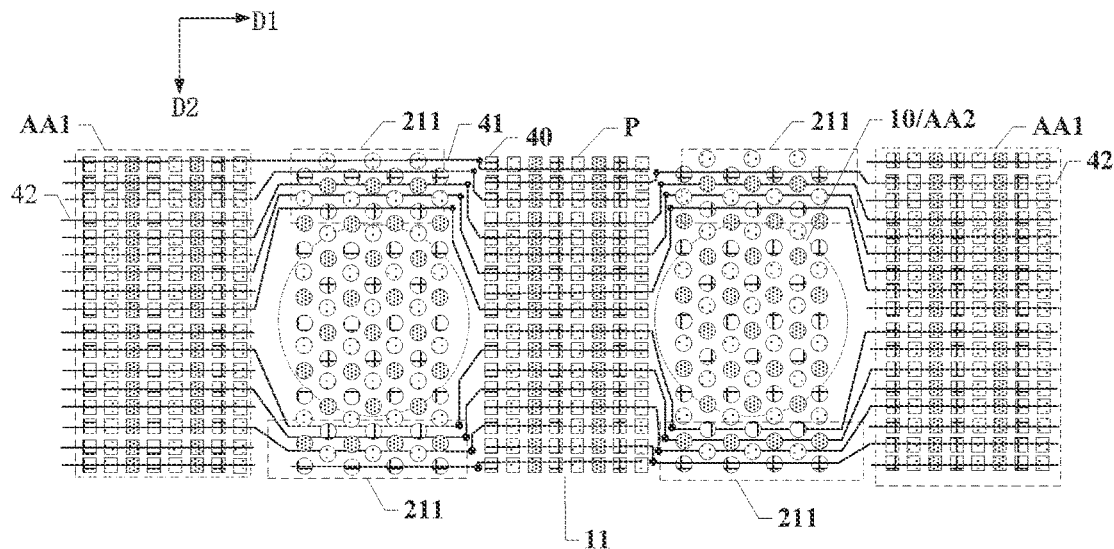
FIG. 16 illustrates another schematic diagram of a plurality of lead wires located between a semi-transparent region and a transition region and between the semi-transparent region and a spacing region.

Referring to FIG. 15, the line segments 411 and 412 that are arranged in a one-to-one correspondence in the first signal line 41 may be electrically connected to each other and may be connected to a same pixel row in the spacing region 11. FIG. 16 illustrates another schematic diagram of a plurality of lead wires located between a semi-transparent region and a transition region and between the semi-transparent region and a spacing region. Referring to FIG. 16, in other embodiments, two groups of first signal lines 41 may be provided on the upper side of the semi-transparent region 10. One group of first signal lines 41 may be located in the first transition region 211 on the upper side of one semi-transparent region 10, and the other group of first signal lines 41 may be located in the first transition region 211 on the upper side of the other semi-transparent region 10. One group of first signal lines 41 may be used to electrically connect to the odd-numbered rows of the sub-pixels in the spacing region 11, and the other group of first signal lines 41 may be used to electrically connect the even-numbered rows of sub-pixels in the spacing region. As such, while providing signals to each row of sub-pixels in the spacing region, the number of first signal lines 41 in the first transition region 211 may be reduced. For the detailed connection relationship of the first signal lines 41 located on the lower side of the semi-transparent region 10, reference may be made to the connection relationship of the first signal lines 41 located on the upper side of the semi-transparent region 10, and the details will not be repeated here.

Figure 17:
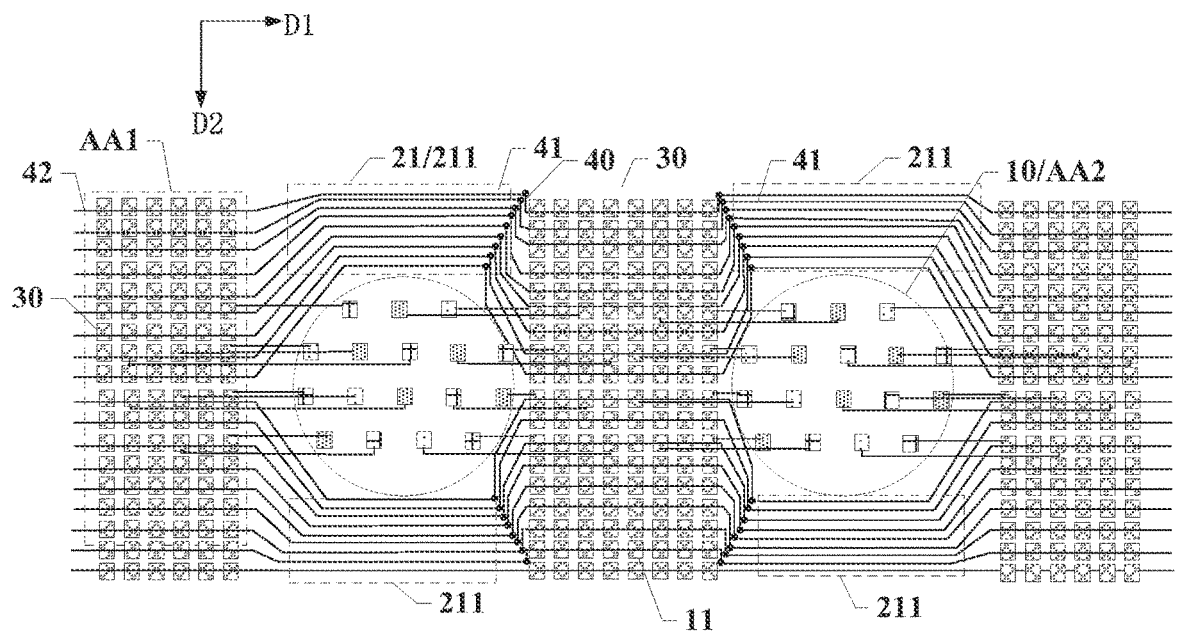
FIG. 17 illustrates another schematic diagram of a plurality of lead wires located between a semi-transparent region and a transition region and between the semi-transparent region and a spacing region.

FIG. 17 illustrates another schematic diagram of a plurality of lead wires located between a semi-transparent region and a transition region and between the semi-transparent region and a spacing region. Referring to FIG. 17, the sub-pixels in a same row in the spacing region 11 may be at least arranged in a same row as a part of the sub-pixels in semi-transparent region 10. In the spacing region 11, the pixel driving circuits 30 corresponding to the sub-pixels that are arranged in a same row in the spacing region 11 and the semi-transparent region 10 may be electrically connected to the same first signal line 41. The first display region AA1 may include a plurality of second signal lines 42 extending along the first direction D1 and arranged along the second direction D2. At least a part of the sub-pixels in the semi-transparent region 10 and at least a part of the sub-pixels in the first display region AA1 may be arranged in a same row. In the first display region AA1, the pixel driving circuits 30 corresponding to the sub-pixels that are arranged in a same row in the first display region AA1 and the semi-transparent region 10 may be electrically connected to a same second signal line 42.

For example, according to various embodiments of the present disclosure, the pixel driving circuits corresponding to the sub-pixels in the semi-transparent region 10 may be arranged in the first display region AA1 and the spacing region 11. A part of the sub-pixels in the semi-transparent region 10 and a part of the sub-pixels in the spacing region 11 may be arranged in a same row. In the semi-transparent region 10 and the spacing region 11, the pixel driving circuits 30 corresponding to the sub-pixels arranged in a same row may be electrically connected to a same first signal line 41. In addition, the pixel driving circuits 30 corresponding to the sub-pixels in the first display region AA1 may be electrically connected to the second signal lines 42, and the second signal lines 42 may provide signals required for the operation of this part of pixel driving circuits. A part of the sub-pixels in the first display region AA1 may be arranged in a same row with a part of the sub-pixels in the semi-transparent region 10. In the first display region AA1, the pixel driving circuits corresponding to the sub-pixels in the first display region AA1 and the semi-transparent region 10 that are arranged in a same row may be electrically connected to a same second signal line 42. As such, when a signal is provided to the sub-pixels in the display region, for example, when a gate signal is provided, the sub-pixels in the same row in the first display region AA1, the semi-transparent region 10, and the spacing region 11 may obtain the same gate signal, such that the sub-pixels located in the same row, as described above, can be illuminated at the same time to avoid picture tearing.

In one embodiment of the present disclosure, referring to FIG. 16, each first signal line 41 of the plurality of first signal lines 41 may be electrically connected to a second signal line 43 located on one of the two sides of the plurality of first signal line 41s along the first direction D1. That is, the second signal line 42 electrically connected a first signal line 41 may be located on one side of the first signal line 31 along the first direction D1. As such, the signals transmitted on the first signal line 41 and the second signal line 42 that are electrically connected to each other may be the same, and a first signal line 41 may be only connected to a second signal line 42 located on one of the two sides of the first signal line 41 in the first direction D1, such that a signal can be transmitted from the second signal line 42 to the first signal line 41, and then transmitted to the corresponding pixel diving circuits through a signal lead wire 40. In the viewing angle shown in FIG. 16, the first signal line 41 located on the upper and lower sides of the left semi-transparent region 10 may be electrically connected to the odd-number rows of sub-pixels in the spacing region 11, and may also be connected to the second signal lines 42 located on the left side of the semi-transparent region 10. The first signal line 41 located on the upper and lower sides of the right semi-transparent region 10 may be electrically connected to the even-number rows of sub-pixels in the spacing region 11, and may also be connected to the second signal lines 42 located on the right side of the semi-transparent region 10. As such, while ensuring that signals such as gate signals can be provided to the sub-pixels in the spacing region 11, the disclosed display panel may also be conducive to reducing the quantity of the first signal lines 41.

Figure 18:
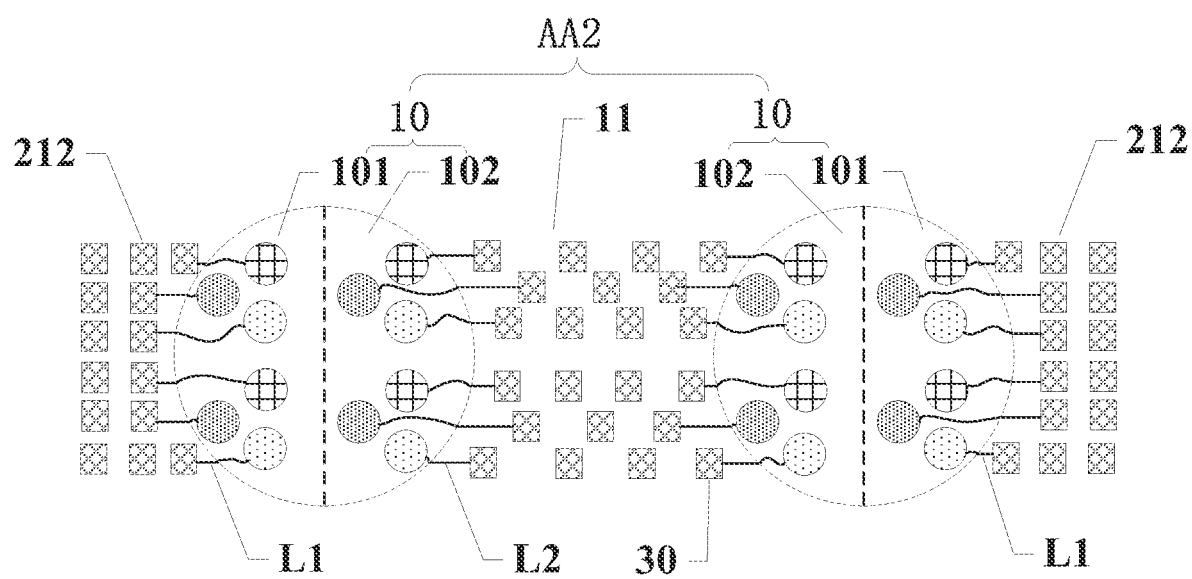
FIG. 18 illustrates a schematic diagram of an exemplary arrangement of a second transition region, a semi-transparent region, and a spacing region.

FIG. 18 illustrates a schematic diagram of an exemplary arrangement of a second transition region, a semi-transparent region, and a spacing region. Referring to FIG. 18, the second transition regions 212, the semi-transparent regions 10, and the spacing region 11 may be arranged along the first direction D1. Each semi-transparent region 10 may include a first semi-transparent region 101 and a second semi-transparent region 102 arranged along the first direction D1. Along the first direction D1, the first semi-transparent region 101 may be located between the second transition region 212 and the second semi-transparent region 102; and the second semi-transparent region 102 may be located between the first semi-transparent region 101 and the spacing region 11. The sub-pixels in the first semi-transparent region 101 may be electrically connected to the pixel driving circuits 30 in the second transition region 212, and the sub-pixels in the second semi-transparent region 102 may be electrically connected to the pixel driving circuits 30 in the spacing region 11.

For example, referring to FIG. 18, in one embodiment of the present disclosure, the semi-transparent region 10 may be divided into a first semi-transparent region 101 and a second semi-transparent region 102 along the first direction D1. The first semi-transparent region 101 may be located on the side of the second semi-transparent region 102 close to the second transition region 212, and the second semi-transparent region 102 may be located on the side of the first semi-transparent region 101 close to the spacing region 11. When the sub-pixels in the semi-transparent region 10 are electrically connected to the pixel driving circuits 30 in the second transition region 212 or in the spacing region 11, the sub-pixels in the first semi-transparent region 101 adjacent to the second transition region 212 may be electrically connected to the pixel driving circuits 30 in the second transition region 212, and the sub-pixels in the second semi-transparent region 102 adjacent to the spacing region 11 may be electrically connected to pixel driving circuits 30 in the spacing region 11. As such, the electrical connections between the sub-pixels in the semi-transparent region 10 and the pixel driving circuits 30 outside the semi-transparent region 10 may be implemented in a close-connection manner, which may be conducive to simplifying the wiring process and improving the production efficiency of the display panel 100.

Figure 19:
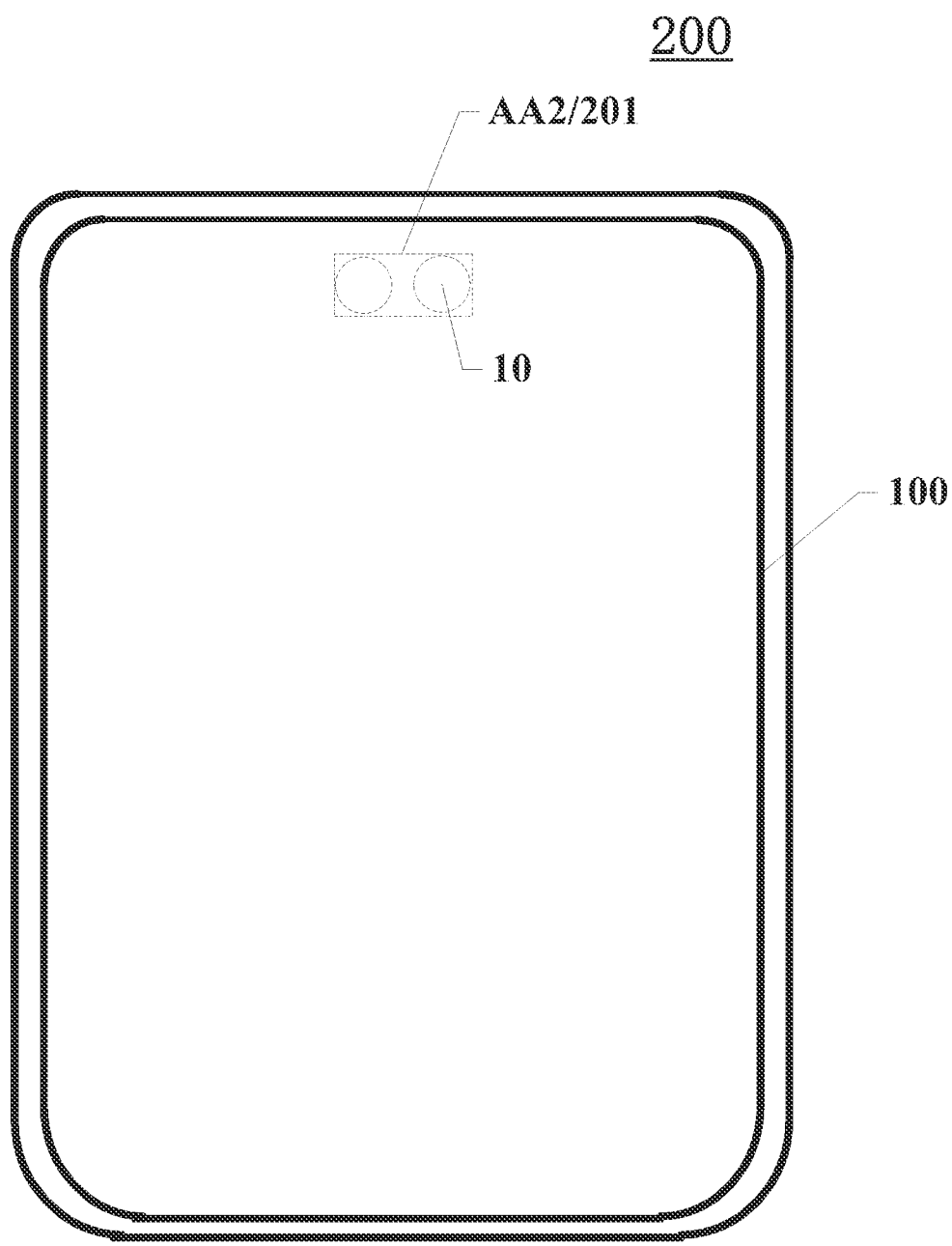
FIG. 19 illustrates a schematic diagram of an exemplary display device according to various embodiments of the present disclosure.

Based on the same principle and concept, the present disclosure also provides a display device. FIG. 19 illustrates a schematic diagram of an exemplary display device according to various embodiments of the present disclosure. Referring to FIG. 19, the display device 200 may include a display panel 100 according to various embodiments of the present disclosure, and a camera 201. The orthogonal projection of the camera 201 on the light-emitting surface of the display panel 100 may be located in the second display region AA2. It should be noted that for the embodiments of the display device 200, reference may be made to the embodiments of the display panel 100 provided above, and the details will not be repeated here. The display device 200 according to various embodiments of the present disclosure may include a mobile phone, a tablet computer, a television, a monitor, a notebook computer, a digital photo frame, a navigator, and any product or component with a display function.

In one embodiment, in one second display region AA2, the display device 200 may include a camera corresponding to the two semi-transparent regions 10, or two cameras corresponding to the two semi-transparent regions 10, respectively.

For example, in a display device according to various embodiments of the present disclosure, an area corresponding to a second display region AA2 may be provided with only one camera, that is, a single camera may be disposed. At this time, the single camera may correspond to both semi-transparent regions 10. In other embodiments, the area corresponding to a second display region AA2 may be provided with two cameras, that is, a dual-camera arrangement method may be adopted. At this time, the two cameras and the two semi-transparent regions 10 may be arranged in a one-to-one correspondence. A spacing region may be introduced between the two semi-transparent regions 10, and the pixel driving circuits corresponding to the sub-pixels in the semi-transparent region 10 may be arranged in the spacing region 10 and the first display region AA1, thereby avoiding the pixel driving circuits 30 corresponding to the sub-pixels in the semi-transparent region 10 from aggregation in the spacing region 11, which may be conducive to simplifying the manufacturing process for the pixel driving circuits 30 electrically connected to the sub-pixels in the semi-transparent region 10 and improving the production efficiency of the display panel 100 and the display device.

According to the disclosure display panel and display device, the display panel and the display device is provided with a first display region and at least one second display region. The first display region at least partially surrounds the second display region, and the second display region include at least two semi-transparent regions and a spacing region disposed between the two semi-transparent regions. During a display stage, the semi-transparent region and the spacing region in the second display region both display; and during a picture-taken stage, the semi-transparent region in the second display region serves as a light-transmissive region to implement the photography function. The sub-pixels in the first display region and the second display region are electrically connected to pixel driving circuits, and the sub-pixels display can be driven by the pixel driving circuits to display. Further, a spacing region is introduced between two adjacent semi-transparent regions, and at least a part of the pixel driving circuits electrically connected to the sub-pixels in the semi-transparent region are disposed in the first display region and the spacing region, thereby avoiding arranging pixel driving circuits in the semi-transparent region and thus affecting the transmittance of the semi-transparent region. Therefore, the disclosed display panel and display device are conducive to increasing the light transmittance of the semi-transparent region, and thus are conducive to improving the photographic quality. In addition, the pixel driving circuits electrically connected to the sub-pixels in the semi-transparent region are partially arranged in the first display region, and partially arranged in the spacing region, so that lead wires connecting the pixel driving circuits and the sub-pixels in the semi-transparent region extend to the semi-transparent region respectively through the first display region and the spacing region. Therefore, the display panel and display device may be conducive to reducing the layout density of lead wires, which in turn is conducive to reducing the crosstalk between adjacent lead wires in the semi-transparent region.

It should be noted that the embodiments described above provide various implementations for improving the strength and wear resistance of the protective film in rollable screens, and also provide various implementations for adjusting the edge segment difference between the protective film and the telescopic bracket. Those skilled in the art may make any reasonable selection according to the actual rollable screen structure, which is not limited by the present disclosure.

It should be noted that the above are only some embodiments of the present disclosure and the applied technical principles. Those skilled in the art shall understand that the present disclosure is not limited to the specific embodiments described herein, and various obvious changes, readjustments, combinations and substitutions can be made without departing from the protection scope of the present disclosure. Therefore, although the present disclosure has been described in detail through the above embodiments, the present disclosure is not limited to the above embodiments, and can also include other equivalent embodiments without departing from the principle of the present disclosure. Any equivalent or modification thereof, without departing from the spirit and principle of the present disclosure, falls within the true scope of the present disclosure.

What is claimed is:

1. A display panel, comprising:
a display region and a non-display region, wherein:
the display region includes a first display region and at least one second display region;
the first display region at least partially surrounds the at least one second display region;
each second display region of the at least one second display region includes at least two photosensitive device setting regions and a spacing region disposed between the at least two adjacent photosensitive device setting regions;
the display region is provided with a plurality of sub-pixels and pixel driving circuits electrically connected to the plurality of sub-pixels;
the pixel driving circuits corresponding to the plurality of sub-pixels in the spacing region are electrically connected to the pixel driving circuits located in the first display region through signal lead wires; and
the signal lead wires are arranged on both sides of sub-pixel rows along a first direction.

2. The display panel according to claim 1, further comprising:
a plurality of first signal lines extending along the first direction and arranged along a second direction, wherein the pixel driving circuits located in a same row in the first display region and the second display region are electrically connected through the first signal lines and the signal lead wires.

3. The display panel according to claim 2, wherein:
the pixel driving circuits located in a same row in the spacing region correspond to the signal lead wires;
a part of the signal lead wires is located at a first side of the sub-pixel rows; and
another part of the signal lead wires is located at a second side of the sub-pixel rows.

4. The display panel according to claim 1, wherein:
the at least two photosensitive device setting regions are semi-transparent regions; and
the pixel driving circuits that are electrically connected to the plurality of sub-pixels in the semi-transparent regions at least partially located in the first display region and the spacing region.

5. The display panel according to claim 4, wherein:
a part of the sub-pixels in each semi-transparent region is electrically connected to pixel driving circuits in the first display region through a plurality of first lead wires;
another part of the sub-pixels in the semi-transparent region is electrically connected to pixel driving circuits in the spacing region through a plurality of second lead wires; and
at least part of the plurality of first lead wires is arranged in a same layer with the plurality of second lead wires.

6. The display panel according to claim 5, wherein:
a line segment of each first lead wire of the plurality of first lead wires located in the semi-transparent regions includes an arc shape;
a line segment of each second lead wire of the plurality of second lead wires located in the semi-transparent regions includes another arc shape; and
the plurality of first lead wires and the plurality of second lead wires are both transparent lead wires.

7. The display panel according to claim 4, wherein:
the first display region includes a regular region and a transition region, wherein:
the transition region is located between the regular region and a second display region of the at least one second display region;
a pixel density of the regular region is greater than or equal to a pixel density of the transition region, and the pixel density of the transition region is greater than or equal to a pixel density of the semi-transparent regions;
a pixel density of the spacing region is greater than or equal to the pixel density of the semi-transparent regions, and the pixel density of the spacing region is greater than or equal to the pixel density of the transition region; and
pixel driving circuits located in the first display region and electrically connected to sub-pixels in the semi-transparent regions are disposed in the transition region.

8. The display panel according to claim 7, wherein:
the pixel driving circuits in the transition region include first pixel driving circuits and second pixel driving circuits;
the first pixel driving circuits are electrically connected to sub-pixels in the transition region in a one-to-one correspondence;
the second pixel driving circuits are electrically connected to sub-pixels in the semi-transparent regions;
the first pixel driving circuits are arranged into an array in the transition region along a first direction and a second direction, wherein the first direction and the second direction intersect each other; and
one or more first pixel driving circuits are located on each side of a group of one or more second pixel driving circuits along the first direction and/or along the second direction.

9. The display panel according to claim 4, wherein:
the pixel driving circuits in the spacing region include third pixel driving circuits and fourth pixel driving circuits, wherein the third pixel driving circuits are electrically connected to sub-pixels in the spacing region in a one-to-one correspondence;
the third pixel driving circuits are arranged into an array in the transition region along the first direction and the second direction, wherein the first direction and the second direction intersect each other;
one or more third pixel driving circuits are located on each side of a group of one or more fourth pixel driving circuits along the first direction and/or along the second direction;
along the first direction, the spacing region is located between two adjacent semi-transparent regions;
the spacing region includes a first spacing region and a second spacing region arranged along the first direction;
the first spacing region is adjacent to a semi-transparent region of the at least two semi-transparent regions, and the second spacing region is adjacent to another semi-transparent region of the at least two semi-transparent regions;
fourth pixel driving circuits in the first spacing region are electrically connected to sub-pixels in the semi-transparent region adjacent to the first spacing region; and fourth pixel driving circuits in the second spacing region are electrically connected to sub-pixels in the semi-transparent region adjacent to the second spacing region.

10. The display panel according to claim 4, wherein:
in a same second display region of the at least one second display region, the at least two semi-transparent regions and the spacing region are arranged along a first direction;
the first display region includes the regular region and the transition region, the transition region located between the regular region and the second display region;
the transition region includes at least one first transition region and at least one second transition region;
the at least one first transition region is arranged on at least one side of the second display region along the second direction, and the at least one second transition region is arranged on at least one side of the second display region along the first direction, wherein the first direction and the second direction intersect each other; and
pixel driving circuits located in the first display region and electrically connected to sub-pixels in the semi-transparent region are disposed in the second transition region.

11. The display panel according to claim 10, wherein:
the first transition region includes a plurality of first signal lines extending along the first direction and arranged along the second direction, wherein pixel driving circuits in the spacing region are electrically connected to the plurality of first signal lines.

12. The display panel according to claim 11, wherein:
the plurality of first signal lines includes at least one of a gate line, a light-emission control signal line, and a reset signal line.

13. The display panel according to claim 11, further including a plurality of signal lead wires, wherein:
sub-pixels in the spacing region are arranged into an array along the first direction and the second direction; and
pixel driving circuits corresponding to sub-pixels located in a same row are electrically connected to a same first signal line through a same signal lead wire of the plurality of signal lead wires, wherein the signal lead wire extends along the second direction.

14. The display panel according to claim 13, wherein:
in the spacing region, the plurality of signal lead wires is arranged on both sides of the sub-pixels along the first direction.

15. The display panel according to claim 14, wherein:
the signal lead wire and the first signal line are disposed in different film layers.

16. The display panel according to claim 11, wherein:
sub-pixels located in a same row in the spacing region are at least arranged in a same row with a part of the sub-pixels in the semi-transparent region;
in the spacing region, pixel driving circuits corresponding to sub-pixels arranged in a same row in the spacing region and the semi-transparent region are electrically connected to a same first signal line;
the first display region includes a plurality of second signal lines extending along the first direction and arranged along the second direction;
at least a part of the sub-pixels in the semi-transparent region is arranged in a same row with at least a part of the sub-pixels in the first display region; and
in the first display region, pixel driving circuits corresponding to sub-pixels arranged in a same row in the first display region and the semi-transparent region are electrically connected to a same second signal line.

17. The display panel according to claim 16, wherein:
a first signal line of the plurality of first signal lines is electrically connected to one second signal line located on one side of the first signal line along the first direction.

18. The display panel according to claim 10, wherein:
the second transition region, the semi-transparent region, and the spacing region are arranged along the first direction;
the semi-transparent region includes a first semi-transparent region and a second semi-transparent region, wherein the first semi-transparent region and the second semi-transparent region are arranged along the first direction;
along the first direction, the first semi-transparent region is disposed between the second transition region and the second semi-transparent region, and the second semi-transparent region is disposed between the first semi-transparent region and the spacing region; and
sub-pixels in the first semi-transparent region are electrically connected to pixel driving circuits in the second transition region, and sub-pixels in the second semi-transparent region are electrically connected to pixel driving circuits in the spacing region.

19. A display device, comprising:
a display panel, including a display region and a non-display region, wherein:
the display region includes a first display region and at least one second display region,
the first display region at least partially surrounds the at least one second display region,
each second display region of the at least one second display region includes at least two photosensitive device setting regions and a spacing region disposed between the at least two adjacent photosensitive device setting regions,
the display region is provided with a plurality of sub-pixels and pixel driving circuits electrically connected to the plurality of sub-pixels,
the pixel driving circuits corresponding to the plurality of sub-pixels in the spacing region are electrically connected to the pixel driving circuits located in the first display region through signal lead wires, and
the signal lead wires are arranged on both sides of sub-pixel rows along a first direction; and
at least one camera, wherein:
an orthogonal projection of each camera of the at least one camera on a light-emitting surface of the display panel is located in the at least one second display region of the display panel.

20. The display device according to claim 19, wherein:
in a second display region of the at least one second display region, the at least one camera corresponds to the at least two semi-transparent regions; or
in the second display region of the at least one second display region, two of the at least two semi-transparent regions correspond to two cameras.

* * * * *